(12) United States Patent
Lee et al.

(10) Patent No.: US 12,117,347 B2
(45) Date of Patent: Oct. 15, 2024

(54) METROLOGY TARGET DESIGN FOR TILTED DEVICE DESIGNS

(71) Applicant: KLA Corporation, Milpitas, CA (US)

(72) Inventors: Myungjun Lee, San Jose, CA (US); Mark D. Smith, Austin, TX (US); Michael E. Adel, Ya'akov Zichron (IL); Eran Amit, Haifa (IL); Daniel Kandel, Aseret (IL)

(73) Assignee: KLA Corporation, Milpitas, CA (US)

( * ) Notice: Subject to any disclaimer, the term of this patent is extended or adjusted under 35 U.S.C. 154(b) by 1092 days.

(21) Appl. No.: 15/287,388

(22) Filed: Oct. 6, 2016

(65) Prior Publication Data

US 2017/0023358 A1   Jan. 26, 2017

Related U.S. Application Data

(63) Continuation of application No. PCT/US2016/028314, filed on Apr. 19, 2016.

(60) Provisional application No. 62/150,290, filed on Apr. 21, 2015.

(51) Int. Cl.
  *G01J 9/00* (2006.01)
  *G03F 7/00* (2006.01)
  *H01L 21/66* (2006.01)

(52) U.S. Cl.
  CPC ............... *G01J 9/00* (2013.01); *G03F 7/705* (2013.01); *G03F 7/70683* (2013.01); *H01L 22/30* (2013.01)

(58) Field of Classification Search
  CPC ........ G01J 9/00; G03F 7/70683; G03F 7/705; G03F 7/70591; H01L 22/30
  See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |
| 6,429,943 B1 | 8/2002 | Opsal et al. |

(Continued)

FOREIGN PATENT DOCUMENTS

| | | |
|---|---|---|
| CN | 100442144 C | 12/2008 |
| CN | 102681358 A | 9/2012 |

(Continued)

OTHER PUBLICATIONS

Norihiro Yamamoto, Jongwook Kye, Harry J. Levinson, "Polarization aberration analysis using Pauli-Zernike representation" Proceedings SPIE 6520, Optical Microlithography XX 65200Y (Mar. 26, 2007) 13 pages.*

(Continued)

*Primary Examiner* — Akash Saxena
(74) *Attorney, Agent, or Firm* — Suiter Swantz IP

(57) ABSTRACT

Metrology methods, modules and targets are provided, for measuring tilted device designs. The methods analyze and optimize target design with respect to the relation of the Zernike sensitivity of pattern placement errors (PPEs) between target candidates and device designs. Monte Carlo methods may be applied to enhance the robustness of the selected target candidates to variation in lens aberration and/or in device designs. Moreover, considerations are provided for modifying target parameters judiciously with respect to the Zernike sensitivities to improve metrology measurement quality and reduce inaccuracies.

40 Claims, 26 Drawing Sheets

(56) References Cited

U.S. PATENT DOCUMENTS

| | | | |
|---|---|---|---|
| 6,985,618 | B2 | 1/2006 | Adel et al. |
| 7,408,642 | B1 | 8/2008 | DiBiase |
| 7,478,019 | B2 | 1/2009 | Zangooie et al. |
| 7,667,842 | B2 | 2/2010 | Schulz |
| 7,925,486 | B2 | 4/2011 | Smith et al. |
| 7,933,026 | B2 | 4/2011 | Opsal et al. |
| 8,214,771 | B2 | 7/2012 | Adel et al. |
| 8,243,256 | B2 * | 8/2012 | Suzuki .............. G03F 7/706 355/77 |
| 9,291,554 | B2 | 3/2016 | Kuznetsov et al. |
| 9,355,200 | B2 * | 5/2016 | Chen ................ G03F 7/706 |
| 9,581,430 | B2 | 2/2017 | Manassen et al. |
| 9,739,702 | B2 | 8/2017 | Bringoltz et al. |
| 9,915,522 | B1 | 3/2018 | Jiang et al. |
| 10,095,122 | B1 * | 10/2018 | Lee .................... G03F 1/84 |
| 10,228,320 | B1 * | 3/2019 | Levinski ............ G06F 30/00 |
| 10,431,468 | B2 * | 10/2019 | deVilliers .......... G06F 30/398 |
| 10,453,692 | B2 * | 10/2019 | deVilliers .......... G03F 7/70525 |
| 10,591,406 | B2 | 3/2020 | Bringoltz et al. |
| 10,769,320 | B2 | 9/2020 | Kuznetsov et al. |
| 2005/0202328 | A1 | 9/2005 | Smith et al. |
| 2005/0210438 | A1 | 9/2005 | Verstappen et al. |
| 2010/0103433 | A1 | 4/2010 | Ausschnitt |
| 2010/0175033 | A1 | 7/2010 | Adel et al. |
| 2012/0293808 | A1 | 11/2012 | Parks et al. |
| 2013/0014065 | A1 | 1/2013 | Feng et al. |
| 2013/0042089 | A1 | 2/2013 | Vinh et al. |
| 2013/0201461 | A1 | 8/2013 | Huang et al. |
| 2014/0136137 | A1 | 5/2014 | Tarshish-Shapir et al. |
| 2015/0048525 | A1 | 2/2015 | Ausschnitt et al. |
| 2015/0186581 | A1 * | 7/2015 | Chen ................ G03F 7/706 716/54 |
| 2017/0023358 | A1 * | 1/2017 | Lee .................... G03F 7/705 |
| 2017/0343903 | A1 * | 11/2017 | Lee .................. G03F 7/70091 |

FOREIGN PATENT DOCUMENTS

| | | |
|---|---|---|
| JP | 2002064055 A | 2/2002 |
| JP | 2005175407 A | 6/2005 |
| JP | 2007504664 A | 3/2007 |
| JP | 2007207822 A | 8/2007 |
| KR | 20140132405 A | 11/2014 |
| TW | 200942985 A | 10/2009 |
| TW | 201042295 A | 12/2010 |
| WO | 2010080732 A3 | 7/2010 |
| WO | WO-2016146355 A1 * | 9/2016 ......... G03F 7/70291 |

OTHER PUBLICATIONS

Gould, Christopher J., Francis G. Goodwin, and William R. Roberts. "Overlay measurement: hidden error." Metrology, Inspection, and Process Control for Microlithography XIV. vol. 3998. International Society for Optics and Photonics, 2000. (Year: 2000).*

Zhou, Jianming, et al. "Improving aberration control with application specific optimization using computational lithography." Optical Microlithography XXIII. vol. 7640. International Society for Optics and Photonics, 2010. (Year: 2010).*

Nakajima, Yumi, et al. "Mask-induced aberration in EUV lithography." Photomask and Next-Generation Lithography Mask Technology XVI. vol. 7379. International Society for Optics and Photonics, 2009. (Year: 2009).*

International Search Report mailed Jul. 27, 2016 for PCT/US2016/028314.

Office Action dated Jun. 11, 2019 for Chinese Patent Application No. 201680021294.3.

Office Action dated Nov. 27, 2019 for Taiwan Patent Application No. 105112489.

English Translation of Office Action dated Nov. 27, 2019 for Taiwan Patent Application No. 105112489.

Office Action received for Taiwanese Application No. 105112489, mailed on Apr. 15, 2020, 5 pages.

Office Action received for Japanese Application No. 2017-555538, mailed May 19, 2020, 6 pages.

Office Action in Taiwanese Application No. 110100858 dated Jul. 29, 2022, 5 pages.

Office Action received in Korean Application No. 10-2017-7033550 dated Nov. 28, 2022, 6 pages (with Translation).

Japanese Patent Office, Office Action received in JP Application No. 2022-195545, Jan. 9, 2024, 6 pages (including translation).

Korean Patent Office, Office Action received in KR Application No. 1020237023993, Dec. 12, 2023, 10 pages (including translation).

Leray et al., "Overlay metrology solutions in a triple patterning scheme," Proc. of SPIE, vol. 9424, Metrology, Inspection, and Process Control for Microlithography XXIX, 2015, 8 pages.

* cited by examiner

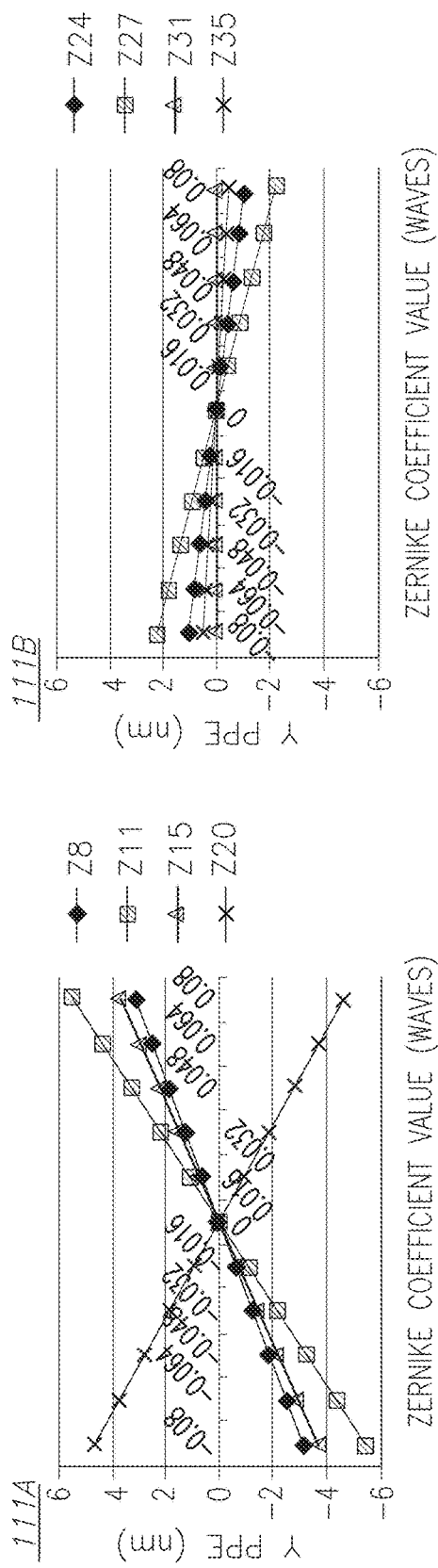
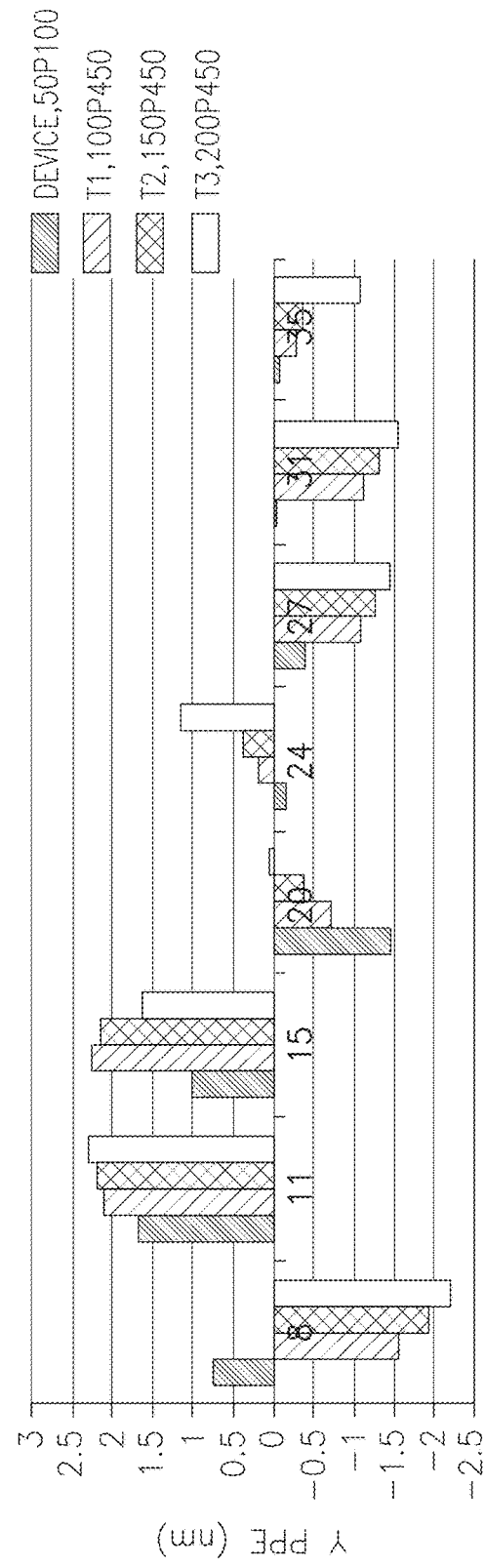
Figure 3A
Figure 3B

_150_

- 160 — CALCULATING A ZERNIKE SENSITIVITY OF PATTERN PLACEMENT ERRORS (PPE'S) OF DEVICE DESIGN(S) AND OF CANDIDATE METROLOGY TARGET DESIGNS

- 165 — DEFINING A COST FUNCTION TO QUANTIFY A SIMILARITY OF THE ZERNIKE SENSITIVITY BETWEEN THE DEVICE DESIGN(S) AND THE CANDIDATE METROLOGY TARGET DESIGNS

- 170 — SELECTING A BEST METROLOGY TARGET DESIGN ACCORDING TO A VALUE OF THE COST FUNCTION DERIVED FROM THE CALCULATED ZERNIKE SENSITIVITIES

- 190 — CARRYING OUT ANY OF THE STAGES BY COMPUTER PROCESSOR(S)

Figure 5

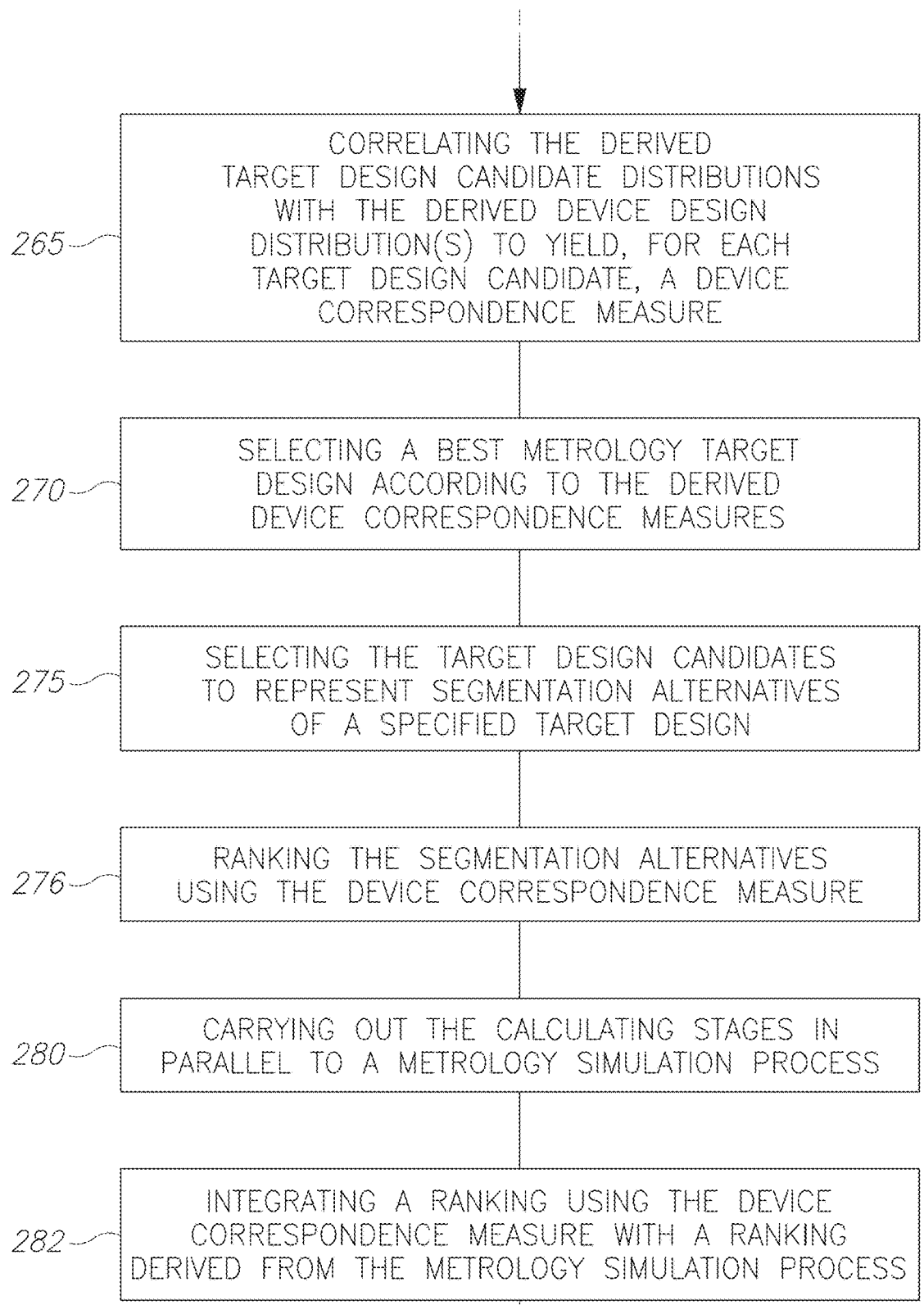
Figure 6 (cont. 1)

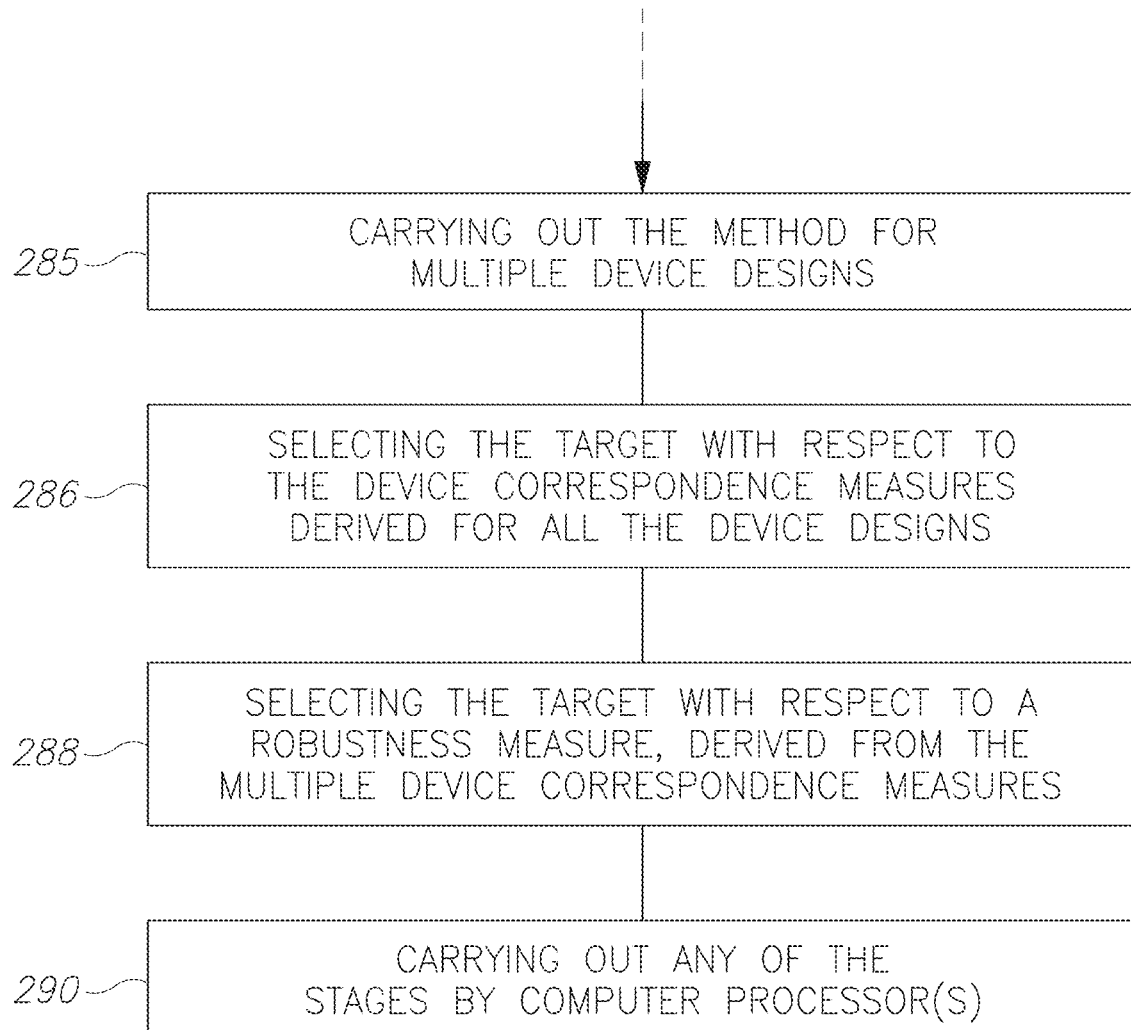
Figure 6 (cont. 2)

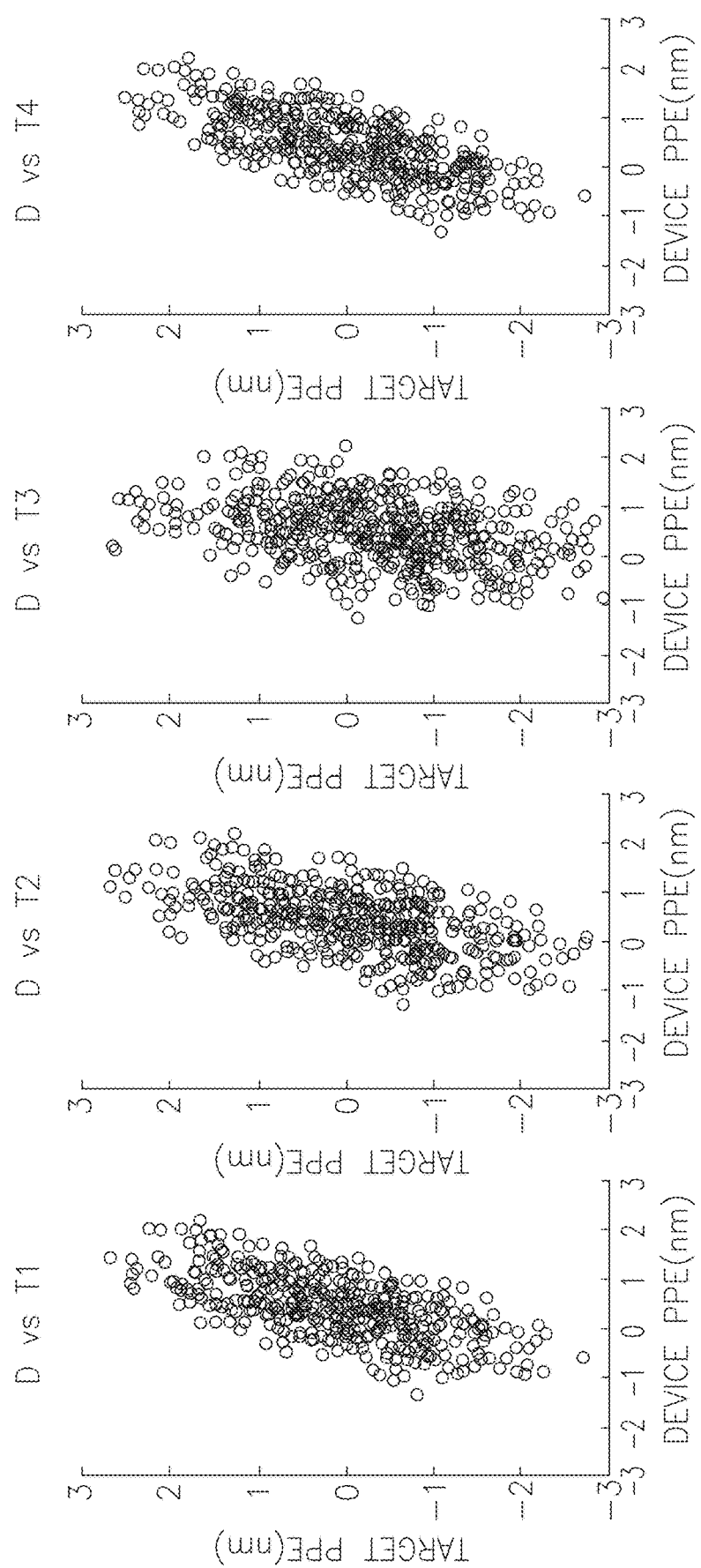
Figure 7 (cont. 1)

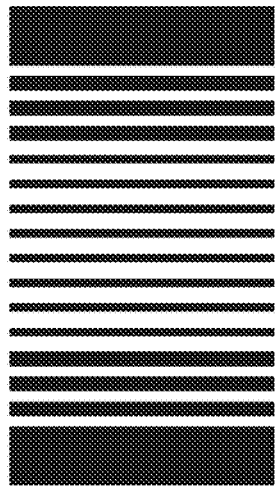
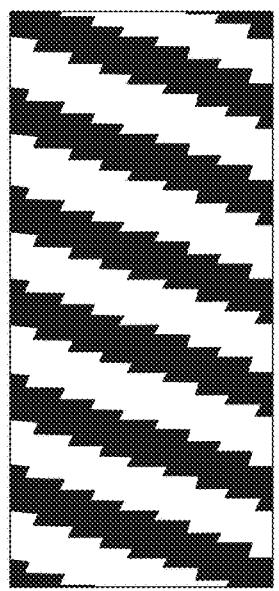
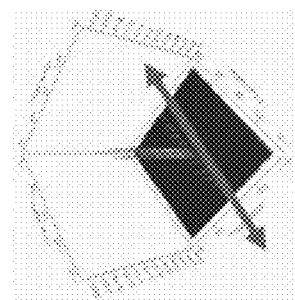
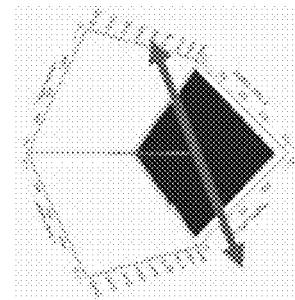
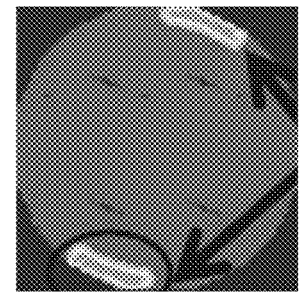
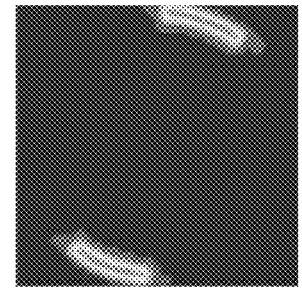
Figure 12A

_400_

- 402 — STARTING WITH AN INITIAL TARGET DESIGN DETERMINED ACCORDING TO METROLOGY PERFORMANCE REQUIREMENTS
- 404 — USING A SIMULATION TOOL
- 410 — COMPARING A ZERNIKE SENSITIVITY OF PATTERN PLACEMENT ERRORS (PPE'S) BETWEEN THE INITIAL TARGET DESIGN AND DEVICE DESIGN(S), WITH RESPECT TO AT LEAST TWO DIRECTIONS
- 420 — ESTIMATING A PROCESS WINDOW FOR THE INITIAL TARGET DESIGN
- 430 — DERIVING AN IMPROVED METROLOGY TARGET DESIGN BY MODIFYING THE INITIAL TARGET DESIGN TO INCREASE A CORRESPONDENCE IN THE ZERNIKE SENSITIVITY AND TO ENLARGE THE PROCESS WINDOW
- 440 — REITERATING THE COMPARING AND THE ESTIMATING FOR CONSECUTIVELY DERIVED IMPROVED TARGET DESIGNS
- 450 — DETERMINING THE TARGET SEGMENTATION WITH RESPECT TO THE DEVICE

Figure 16

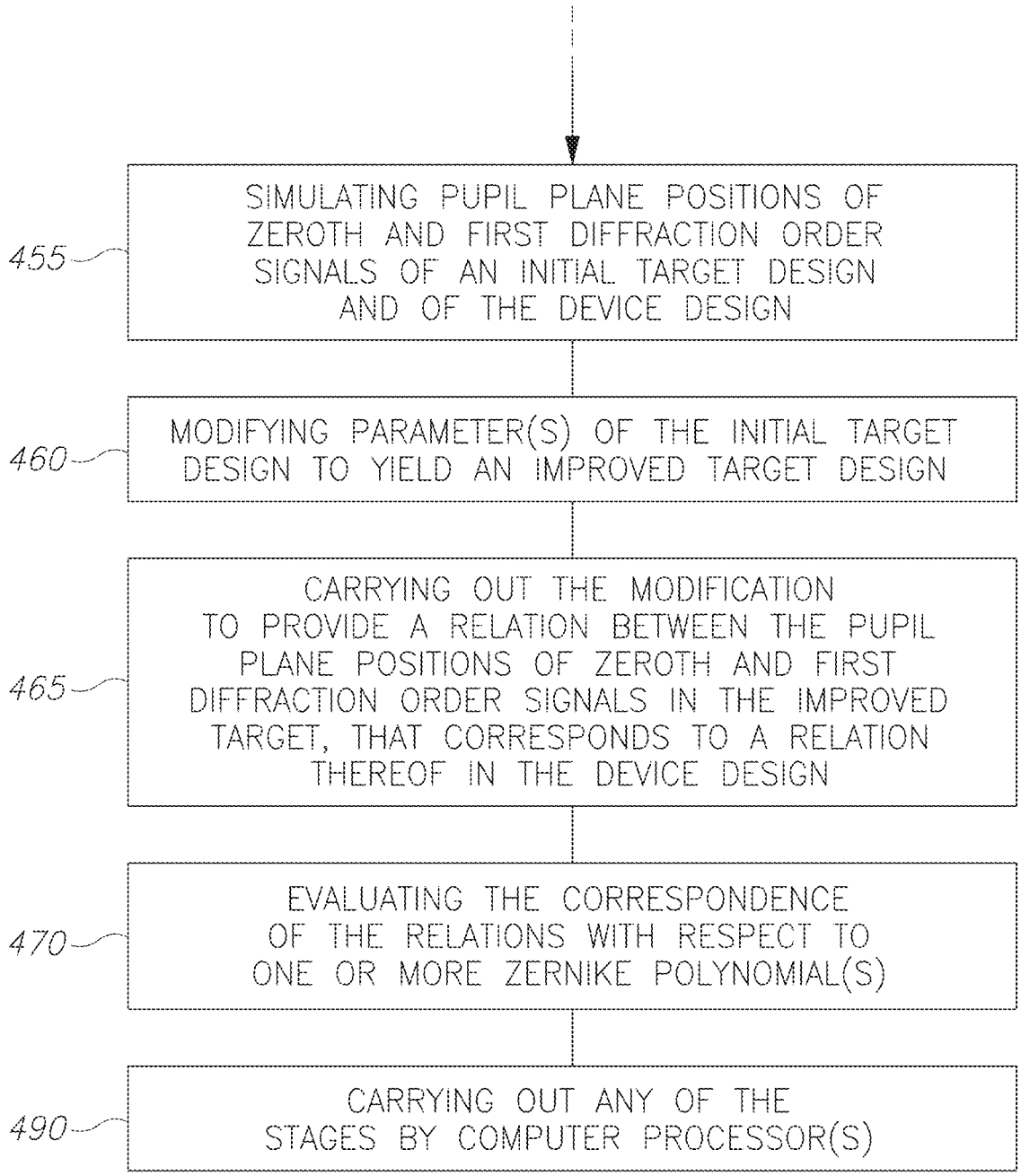
Figure 16 (cont. 1)

METROLOGY TARGET DESIGN FOR TILTED DEVICE DESIGNS

CROSS REFERENCE TO RELATED APPLICATIONS

This application is filed under 35 U.S.C. § 120 and § 365(c) as a Continuation of International Application Serial No. PCT/US2016/028314, filed on Apr. 19, 2016, which application claims the benefit under 35 U.S.C. § 119(e) and Article 4 of the Stockholm Act of the Paris Convention for the Protection of Industrial Property of U.S. Provisional Patent Application No. 62/150,290 filed on Apr. 21, 2015, which is incorporated herein by reference in its entirety.

FIELD OF THE INVENTION

The present invention relates to the field of metrology, and more particularly, to metrology target design.

BACKGROUND OF THE INVENTION

In the field of semiconductor metrology, a metrology tool may comprise an illumination system which illuminates a target, a collection system which captures relevant information provided by the illumination system's interaction (or lack thereof) with a target, device or feature, and a processing system which analyzes the information collected using one or more algorithms. Metrology tools can be used to measure structural and material characteristics (e.g., material composition, dimensional characteristics of structures and films such as film thickness and/or critical dimensions of structures, overlay, etc.) associated with various semiconductor fabrication processes. These measurements are used to facilitate process controls and/or yield efficiencies in the manufacture of semiconductor dies. Metrology tools may include one or more hardware configurations which may be used in conjunction with certain embodiments of this invention to, e.g., measure the various aforementioned semiconductor structural and material characteristics. Examples of such hardware configurations include the following: a spectroscopic ellipsometer (SE), a SE with multiple angles of illumination, a SE measuring Mueller matrix elements (e.g., using rotating compensator(s)), a single-wavelength ellipsometers, a beam profile ellipsometer (angle-resolved ellipsometer), a beam profile reflectometer (angle-resolved reflectometer), a broadband reflective spectrometer (spectroscopic reflectometer), a single-wavelength reflectometer, an angle-resolved reflectometer, any imaging system, a pupil imaging system, a spectral imaging system, a scatterometer (e.g., speckle analyzer) etc.

The hardware configurations can be separated into discrete operational systems. On the other hand, one or more hardware configurations can be combined into a single tool. One example of such a combination of multiple hardware configurations into a single tool is provided by U.S. Pat. No. 7,933,026 (including e.g., a broadband SE, a SE with rotating compensator, a beam profile ellipsometer, a beam profile reflectometer, a broadband reflective spectrometer, and a deep ultra-violet reflective spectrometer) which is incorporated herein by reference in its entirety. In addition, there are typically numerous optical elements in such systems, including certain lenses, collimators, mirrors, quarter-wave plates, polarizers, detectors, cameras, apertures, and/or light sources. The wavelengths for optical systems can vary from about 120=nm to 3 microns. For non-ellipsometer systems, signals collected can be polarization-resolved or unpolarized. Multiple metrology heads may be integrated on the same tool, however, in many cases, multiple metrology tools are used for measurements on a single or multiple metrology targets, as described e.g., in U.S. Pat. No. 7,478,019, which is incorporated herein by reference in its entirety.

The illumination system of the certain hardware configurations includes one or more light sources. The light source may generate light having only one wavelength (i.e., monochromatic light), light having a number of discrete wavelengths (i.e., polychromatic light), light having multiple wavelengths (i.e., broadband light) and/or light that sweeps through wavelengths, either continuously or hopping between wavelengths (i.e., tunable sources or swept source). Examples of suitable light sources are: a white light source, an ultraviolet (UV) laser, an arc lamp or an electrode-less lamp, a laser sustained plasma (LSP) source, a supercontinuum source (such as a broadband laser source), or shorter-wavelength sources such as x-ray sources, extreme UV sources, or some combination thereof. The light source may also be configured to provide light having sufficient brightness, which in some cases may be a brightness greater than about 1 W/(nm cm$^2$ Sr). The metrology system may also include a fast feedback to the light source for stabilizing its power and wavelength. Output of the light source can be delivered via free-space propagation, or in some cases delivered via optical fiber or light guide of any type.

The metrology targets may possess various spatial characteristics and are typically constructed of one or more cells which may include features in one or more layers which may have been printed in one or more lithographically distinct exposures. The targets or the cells may possess various symmetries such as two fold or four fold rotation symmetry, reflection symmetry, as described e.g., in U.S. Pat. No. 6,985,618, which is incorporated herein by reference in its entirety. Different cells or combinations of cells may belong to distinct layers or exposure steps. The individual cells may comprise either isolated non-periodic features or alternately they may be constructed from one, two or three dimensional periodic structures or combinations of non-periodic and periodic structures as e.g., in U.S. Patent Publication No. 2013/042089, which is incorporated herein by reference in its entirety. The periodic structures may be non-segmented or they may be constructed from finely segmented features which may at or close to the minimum design rule of the lithographic process used to print them. The metrology targets may also be collocated or in close proximity with dummification structures in the same layer or in a layer above, below or in between the layers of the metrology structures. Targets can include multiple layers (or films) whose thicknesses can be measured by the metrology tool. Targets can include target designs placed (or already existing) on the semiconductor wafer for use, e.g., with alignment and/or overlay registration operations. Certain targets can be located at various places on the semiconductor wafer. For example, targets can be located within the scribe lines (e.g., between dies) and/or located in the die itself. Multiple targets may be measured (at the same time or at differing times) by the same or multiple metrology tools as described e.g., in U.S. Pat. No. 7,478,019, which is incorporated herein by reference in its entirety. The data from such measurements may be combined. Data from the metrology tool is used in the semiconductor manufacturing process for example to feed-forward, feed-backward and/or feed-sideways corrections to the process (e.g., lithography, etch), see e.g., U.S. Pat. No. 8,930,156, which is incorporated herein by reference in its entirety, disclosing feed forward methods for reusing metrology target cells; and therefore, might yield a complete process control solution. The metrology tools are designed to make many different types of measurements related to semiconductor manufacturing, for example measure characteristics of one or more targets, such as critical dimensions, overlay, sidewall angles, film thicknesses, process-related parameters (e.g., focus and/or dose). The targets can include certain regions of interest that are periodic in nature, such as for example gratings in a memory die.

As semiconductor device pattern dimensions continue to shrink, smaller metrology targets are often required. Furthermore, the measurement accuracy and matching to actual device characteristics increase the need for device-like targets as well as in-die and even on-device measurements. Various metrology implementations have been proposed to achieve that goal. For example, focused beam ellipsometry based on primarily reflective optics is described e.g., in U.S. Pat. No. 5,608,526, which is incorporated herein by reference in its entirety. Apodizers can be used to mitigate the effects of optical diffraction causing the spread of the illumination spot beyond the size defined by geometric optics, as described e.g., in U.S. Pat. No. 5,859,424, which is incorporated herein by reference in its entirety. The use of high-numerical-aperture tools with simultaneous multiple angle-of-incidence illumination is another way to achieve small-target capability, as described e.g., in U.S. Pat. No. 6,429,943 which is incorporated herein by reference in its entirety. Other measurement examples may include measuring the composition of one or more layers of the semiconductor stack, measuring certain defects on (or within) the wafer, and measuring the amount of photolithographic radiation exposed to the wafer. In some cases, metrology tool and algorithm may be configured for measuring non-periodic targets, as described e.g., in U.S. patent application Ser. No. 14/294,540 and in U.S. Patent Publication No. 2014/0222380, which are incorporated herein by reference in their entirety.

Measurement of parameters of interest usually involves a number of algorithms, carried out by corresponding analysis units in the respective metrology tools. For example, optical interaction of the incident beam with the sample is modeled using EM (electro-magnetic) solver and uses such algorithms as RCWA (Rigorous Coupled Wave Analysis), FEM (finite element method), method of moments, surface integral method, volume integral method, FDTD (Finite Difference Time Domain), and others. The target of interest is usually modeled (parametrized) using a geometric engine, or in some cases, process modeling engine or a combination of both. The use of process modeling is described e.g., in U.S. Patent Publication No. 2014/0172394, which is incorporated herein by reference in its entirety. A geometric engine is implemented, for example, in AcuShape software product of KLA-Tencor.

Collected data can be analyzed by a number of data fitting and optimization techniques an technologies including libraries, Fast-reduced-order models; regression; machine-learning algorithms such as neural networks, support-vector machines (SVM); dimensionality-reduction algorithms such as, e.g., PCA (principal component analysis), ICA (independent component analysis), LLE (local-linear embedding); sparse representation such as Fourier or wavelet transform; Kalman filter; algorithms to promote matching from same or different tool types, and others. Collected data can also be analyzed by algorithms that do not include modeling, optimization and/or fitting modeling as described e.g., in U.S. Patent Publication No. 2014/0257734, which is incorporated herein by reference in its entirety. Computational algorithms are usually optimized for metrology applications with one or more approaches being used such as design and implementation of computational hardware, parallelization, distribution of computation, load-balancing, multi-service support, dynamic load optimization, etc. Different implementations of algorithms can be done in firmware, software, FPGA (Field Programmable Gate Array), programmable optics components, etc. The data analysis and fitting steps usually pursue one or more of the following goals: Measurement of CD (critical dimension), SWA (side wall angle), shape, stress, composition, films, bandgap, electrical properties, focus/dose, overlay, generating process parameters (e.g., resist state, partial pressure, temperature, focusing model), and/or any combination thereof; modeling and/or design of metrology systems; and modeling, design, and/or optimization of metrology targets.

Metrology targets in general and overlay metrology targets in particular are required to accurately represent the relative placement between device features in different layers. It is known that the presence of optical aberrations in the exposure tool may induce pattern placement errors which vary depending on the spatial characteristics of the features. Furthermore, extreme off-axis illumination combined with masks including OPC are commonly used for the most critical layers in advanced semiconductor manufacturing nodes increasing the placement error sensitivity to scanner aberrations. Any discrepancy between the spatial characteristics of the device versus those of the metrology target are therefore likely to induce a bias between metrology results and the actual device edge placement which is sought in order to provide control correctable back to the lithographic exposure tool. For example, U.S. Pat. Nos. 8,214,771 and 7,925,486 which are incorporated herein by reference in their entirety, teach the use of lithographic or metrology simulations in order to predict the performance of metrology targets in terms of precision, accuracy and device correlation. Lithography simulations are used in order to predict the aberration induced pattern placement errors of metrology targets and compare them with placement errors incurred by device features under the same aberration conditions.

FIG. 1 is a high level schematic illustration of an example of the impact of scanner aberrations on a device pattern with respect to two different types of overlay metrology marks, which illustrate prior art pattern placement error (PPE) analysis according to the prior art. The discrepancy in pattern placement errors between the metrology target and device feature are demonstrated for the given example lens aberration, as enabled by lithographic simulations by various methods including Kirchoff approximation for the mask simulation and full physical model for the resist. The PPE discrepancy between the device and different types of metrology targets (SCOL—scatterometry overlay targets and AIM—advanced imaging metrology targets) is demonstrated for two different lithography layers (gate layer—at the bottom, and gate cut layer at the top of FIG. 1). The illumination source is schematically depicted to the left of FIG. 1—dipole Y illumination source is used for the gate layer (bottom) and C-quad source is used for the gate cut layer (top). The example lens aberration (RMS=8.4 mWaves, Milliwaves express an aberration, such as a lens aberration in unit of wavelength—i.e., thousandths of the used wavelength) used for these PPE calculations is shown at the bottom of FIG. 1. FIG. 1 exemplifies that there are large and non-correlated PPEs for the two processes, resulting in large measurement errors. Due to the use of different feature size of the device and metrology targets, their diffracted wavefronts are almost always not identical. As a result, the PPE discrepancy between the metrology target and device feature is inevitable and the amount of the PPE is strongly depending on the feature size and illumination shape

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method of metrology target design, the method comprising calculating a Zernike sensitivity of pattern placement errors (PPEs) of at least one device design and of a plurality of metrology target designs, and selecting a best metrology target design according to a value of a cost function derived from the calculated Zernike sensitivities, the cost function quantifying a similarity of the Zernike sensitivity between the at least one device design and the plurality of metrology target designs.

One aspect of the present invention provides a method of metrology target design, the method comprising: for each of at least one device design and a plurality of target design candidates: (i) repeatedly for a plurality of runs: generating a plurality of $N_i$ ($N_i>100$) Zernike coefficient values for each of a plurality of Zernike polynomials $Z_i$, the values generated pseudo-randomly with respect to specified distributions over specified ranges, calculating PPEs for each of the Zernike polynomials, and calculating a respective PPE measure for the run; and deriving a distribution of the calculated respective PPE measures; (ii) correlating each of the derived target design candidate distributions with the at least one derived device design distribution to yield for each target design candidate a device correspondence measure; and (iii) selecting a best metrology target design according to the derived device correspondence measures.

One aspect of the present invention provides a method of optimizing metrology target design, the method comprising, starting with an initial target design determined according to metrology performance requirements, and using a simulation tool: comparing a Zernike sensitivity of pattern placement errors (PPEs) between the initial target design and at least one device design, with respect to at least two directions, estimating a process window for the initial target design, and deriving an improved metrology target design from the initial target design by modifying the initial target design to increase a correspondence in the Zernike sensitivity and to increase the process window.

One aspect of the present invention provides a method of determining a target design with respect to a device design, the method comprising: simulating pupil plane positions of zeroth and first diffraction order signals of an initial target design and of the device design, and modifying at least one parameter of the initial target design to yield an improved target design, the modification carried out to provide a relation between the pupil plane positions of zeroth and first diffraction order signals in the improved target that corresponds to a relation thereof in the device design.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 3A illustrates exemplary simulation results of Zernike sensitivity for a device that comprises a line and space structure aligned in x-direction with 100 nm pitch and 50 nm CD under Dipole Y illumination, according to some embodiments of the invention.

FIG. 3B exemplifies a comparison of the Zernike sensitivity among three metrology target candidates having different parameters and a device, according to some embodiments of the invention.

FIGS. 5 and 6 are high level schematic flowcharts of methods of target design and/or selection, according to some embodiments of the invention.

FIG. 12A is a schematic illustration explaining the lack of prior art target sensitivity to Y-odd aberrations.

FIG. 16 is a high level schematic flowchart of a method of optimizing metrology target design, according to some embodiments of the invention.

DETAILED DESCRIPTION OF THE INVENTION

Figure 1:
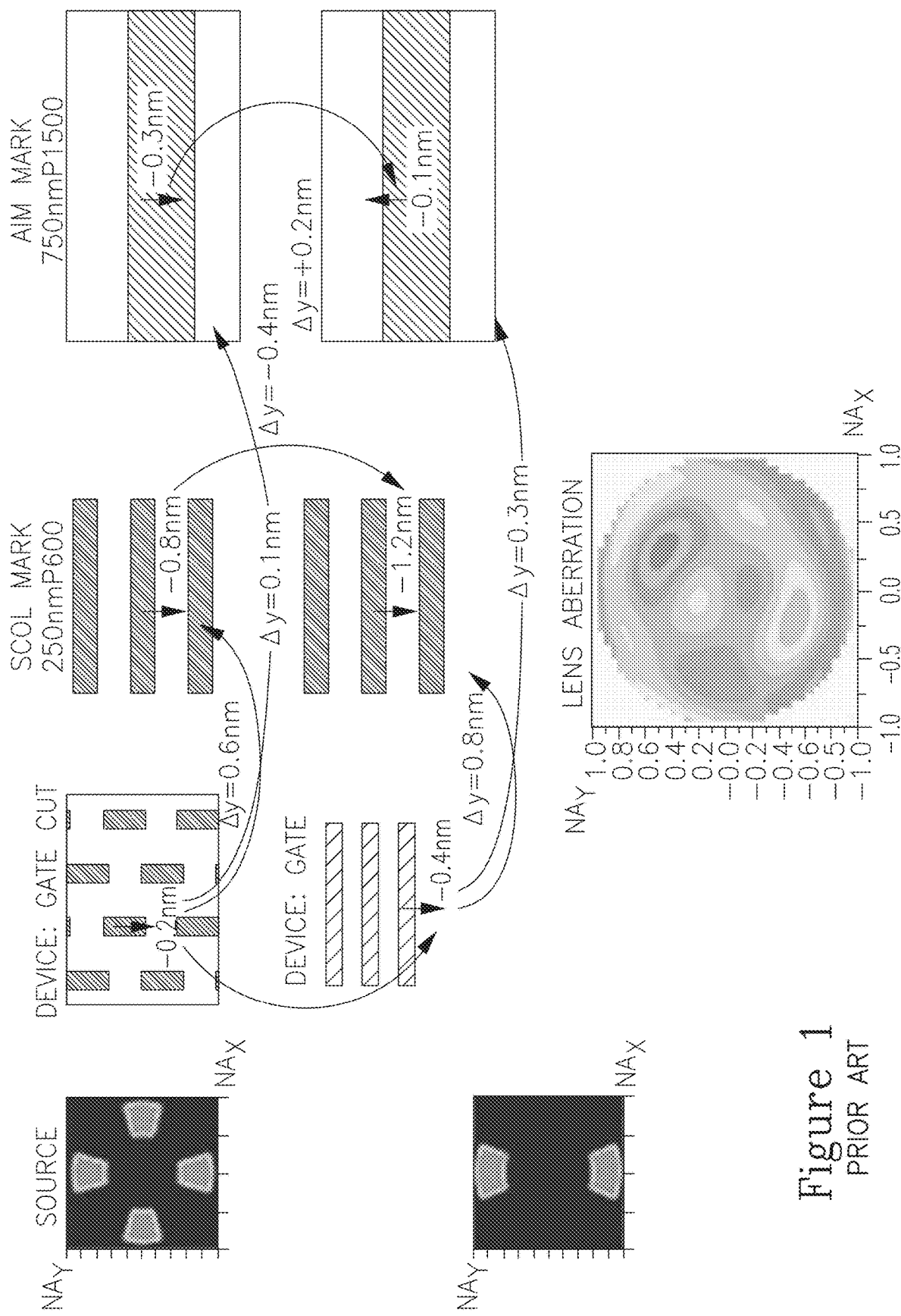
FIG. 1 is a high level schematic illustration of an example of the impact of scanner aberrations on a device pattern with respect to two different types of overlay metrology marks, which illustrate prior art pattern placement error (PPE) analysis according to the prior art.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanisms for optimizing metrology target designs with respect to metrology parameters, optical aberrations and process parameters in a way that improves the correspondence between the targets and the devices.

Metrology methods, modules and targets are provided, for measuring tilted device designs. The methods analyze and optimize target design with respect to the relation of the Zernike sensitivity of pattern placement errors (PPEs) between target candidates and device designs. Monte Carlo methods may be applied to enhance the robustness of the selected target candidates to variation in lens aberration and/or in device designs. Moreover, considerations are provided for modifying target parameters judiciously with respect to the Zernike sensitivities to improve metrology measurement quality and reduce inaccuracies.

Figure 2:
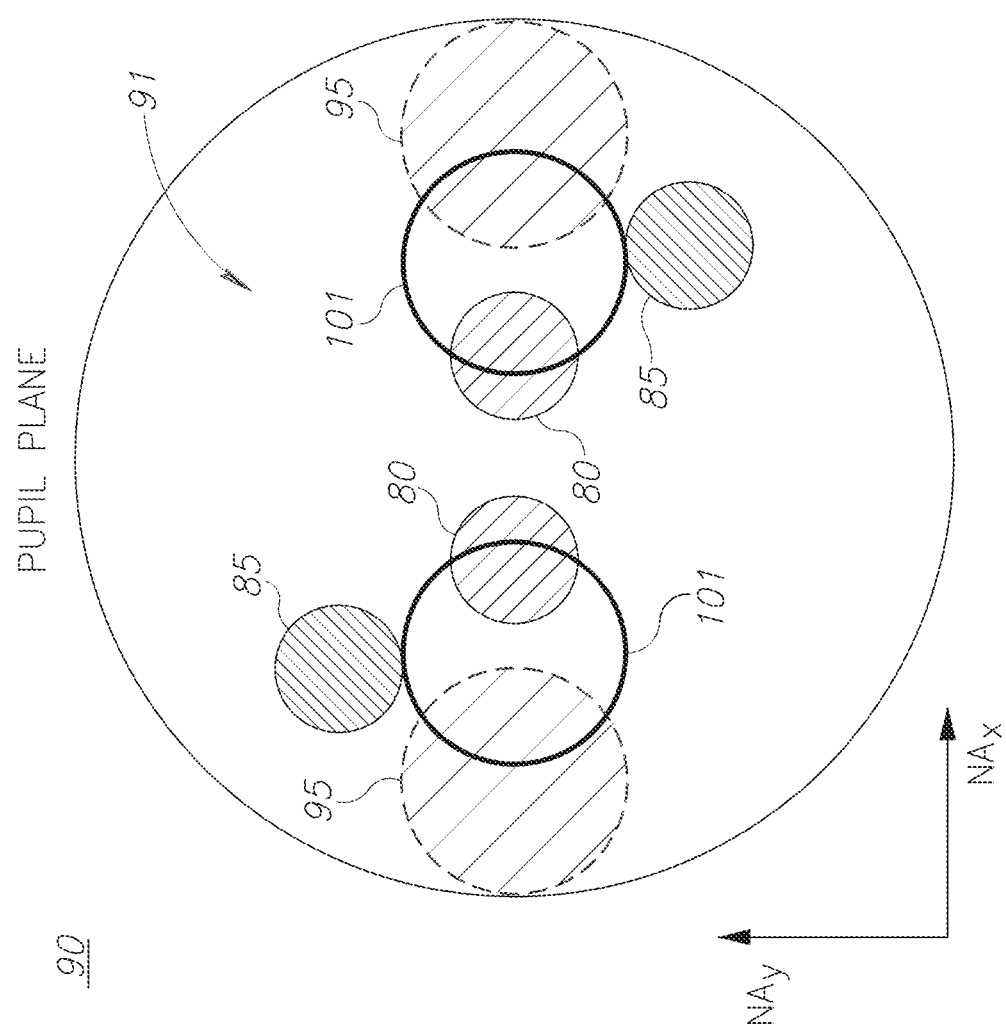
FIG. 2 is a high level schematic illustration of various illuminations, presented in a pupil plane of an optical system, according to the prior art and according to some embodiments of the invention.

FIG. 2 is a high level schematic illustration of various illuminations, presented in a pupil plane 90 of an optical system, according to the prior art and according to some embodiments of the invention. Illuminations 80, 85 represent scanner illumination when producing devices of pitches of tens to few hundreds of nanometers (nm), e.g., currently typically 80 nm. Illumination 80 represents x axis illumination (in numerical aperture coordinates, $NA_x$) and illumination 85 represents tilted illumination (i.e., having a $Na_y$ component) applicable for certain devices, e.g., memory devices. Illumination 95 represents prior art metrology tool illumination for measuring targets which are at least one order of magnitude larger than the devices, typically 1000-2000 nm. Due to the larger pitch, illumination 95 covers different pupil coordinates than scanner illumination 80, and typically lacks a $Na_y$ component. Arrow 91 represents a practiced way of analyzing pupil plane aberrations using even and odd Zernike polynomials ($Z_n^m(\rho, \varphi) = R_n^m(\rho)\cos(m\varphi)$ and $Z_n^{-m}(\rho, \varphi) = R_n^m(\rho)\sin(m\varphi)$, respectively, with the corresponding Zernike radial polynomials $R_n^m(\rho)$). As scanner illumination 80, 85 typically uses different regions in pupil plane 90 than the regions the prior art metrology illumination 95 uses, it experiences different aberrations and metrology measurements suffer a corresponding inaccuracy.

In the present invention, an analysis of pupil plane aberrations via its representation in the Zernike polynomials is used to modify metrology target pitches and metrology illumination 101 to provide a better correspondence of the metrology measurements to device parameters and reduce the metrology inaccuracy. Disclosed methods enable to optimize the metrology targets and to predict the pattern placement error (PPE) discrepancy especially for patterns which are tilted from vertical or horizontal axis when lens aberrations exist. Disclosed methods relate to the design and/or optimization of design of metrology targets to be used in the measurement of optical and/or structural and/or placement characteristics of either device or test features during semiconductor manufacture. Examples of optical or structural characteristics comprise critical dimensions such as height, side wall angle, pitch, linewidth, film thickness, refractive indices and overlay between different layers or between exposures within a single layer. The designed metrology targets may also be used to measure focus and dose of lithographic patterning of semiconductor devices. The methods enable the design and/or optimization of metrology targets that track the aberration induced pattern placement errors incurred by device features more effectively than the prior art. The methods enable the design of robust metrology targets which minimize placement error discrepancies especially for tilted device features with respect to vertical/horizontal directions. Advantageously, disclosed methods optimize imaging overlay targets especially for the tilted line and space patterns in memory applications, and may yield estimated reductions of 26% in pattern placement error.

Certain embodiments comprise target design methods that (i) implement Zernike sensitivity analysis with a cost function and/or (ii) use a Monte Carlo approach to analyze the sensitivity, and enable design optimization for device aberration tracking. The disclosed methods may be integrated in metrology target design processes in various ways such as:

(i) to yield segmentation alternatives, i.e., detailed construction of metrology target can be defined and all or a subset of such design permutations can be analyzed by PPE analysis as described below. The subset of winning contenders may be subsequently sent to a second metrology simulation step which quantifies and ranks the remaining contenders. (ii) The PPE analysis may be carried out in parallel with the metrology simulation step in order to minimize time to result. (iii) The subset of the contenders which were ranked high by the metrology simulation step may be used as input for the PPE analysis.

PROLITH simulations may be used to build lithography models for the device as well as target candidates, and PROLITH programming interface (PPI) with Matlab may be used for Zernike sensitivity and Monte Carlo analysis. To demonstrate the concept, the realistic lithography conditions for the use of an immersion lithography tool are used, in a non-limiting manner. The device is assumed to be a line and space structure aligned in x-direction, therefore the proper choice of illumination is dipole Y source as shown in FIG. 1. A bright field mask (BFM) with positive tone development process is used to print the pattern in the resist. Full physical resist model together with Kirchhoff mask simulation mode is used. It is emphasized that a similar approach may be applied to any realistic types of device, target and illumination.

Zernike Sensitivity Analysis

In practice, an aberration free imaging system can never be achieved because of difficulty to make a perfect lens, therefore aberration is the fundamental problem for the lithographic lens. Such lens aberration can cause positional errors of the printed features from the nominal center position that is called pattern placement error (PPE). Lens aberration behavior can be characterized by the numerical values of 36 Zernike coefficients, and any example of lens aberration (see e.g., bottom of FIG. 1) can be expressed as a mixture of Zernike polynomial terms. In particular, the PPE under the influence of lens aberrations can be modeled as expressed in Equation 1, with PPE(Z=0) representing the placement error without lens aberration and PPE($Z_i$) representing placement error for the $i^{th}$ Zernike coefficient value.

$$PPE(Z) \approx PPE(Z=0) + \Sigma_{i=4}^{36} PPE(Z_i) \qquad \text{Equation 1}$$

The Zernike sensitivity to the PPE may be defined as $\partial PPE_i/\partial Z_i$, providing critical information about the overlay performance. It is noted that as the Z2 and Z3 terms, corresponding to the tilt of the stage, are typically maintained to be zero after the correction, Equation 1 uses only i=4 . . . 36. The device Y-PPE for i=4 . . . 36 may be initially calculated as a function of Zernike coefficient values, and may vary between ca. −80 mWaves to +80 mWaves. The inventors have found out that the Y-PPE has the sensitivity only to odd Zernike polynomials such as Z8, Z11, Z15, Z20, Z24, Z27, Z31, and Z35, as illustrated in FIG. 3A, simulated under conditions similar to FIG. 1. FIG. 3A illustrates exemplary simulation results of Zernike sensitivity for a device that comprises a line and space structure aligned in x-direction with 100 nm pitch and 50 nm CD under Dipole Y illumination, according to some embodiments of the invention. FIG. 3A illustrates a linear relationship (111A, 111B) of the PPE with the Zernike coefficient variation, in the illustrated case Zernike coefficients Z8, Z11, Z15 and Z20. The sensitivity of the PPE is different to different Zernike coefficients, resulting in different impacts of the coefficients on the PPE. Similar analysis can be performed for X-PPE.

Different targets may be compared with respect to their Zernike sensitivity, and the target having its Zernike sensitivity closest to the device's Zernike sensitivity may be selected to provide the appropriate metrology measurements. Ideally, given a certain lens aberration of the lithography tool, an ideal overlay target has device-like Zernike sensitivity. FIG. 3B exemplifies a comparison of the Zernike sensitivity among three metrology target candidates having different parameters and a device, according to some embodiments of the invention. FIG. 3B presents the results of computing device and targets' Y-PPE per each Zernike term (Z8, Z11, Z15, Z20, Z24, Z27, Z31 and Z35). Here, constant Zernike coefficient value of 20 mWaves is assumed for Z4 . . . Z36. In the example, targets T1, T2, T3 have a same pitch, 450 nm, and differ in CD to have values of 100 nm, 150 nm, 200 nm, respectively.

Any target comparison data may be used to extract the rank for available target candidates with a cost function metric, for example as provided in Equation 2, with $PPE_D$ and $PPE_T$ representing the device PPE and the target PPE, respectively.

$$\Sigma_{k=i}^{n} \sqrt{(PPE_D(Z_i) - PPE_T(Z_i))^2}, \text{ for } i=4 \ldots 36 \qquad \text{Equation 2}$$

The cost function expressed in Equation 2 provides the PPE discrepancy between the device and the target, and therefore enables to select the best performing target for the given nominal value of Zernike coefficient. The results for the exemplary non-limiting comparison presented in FIG. 3B are summarized in Table 1. In this illustrative example, Target 4 has the highest ranking and is selected to provide the metrology measurements that best represent the device under the simulated lens aberration and conditions. In certain embodiments, the ranking methodology may take into account additional factors such as lithographic metrics and other metrology metrics.

TABLE 1

An exemplary comparison of candidate targets to a device using the cost function of Equation 2.

| | Pitch (nm) | CD (nm) | Cost (nm) | Ranking |
|---|---|---|---|---|
| Device | 100 | 50 | | |
| Target1 | 450 | 100 | 7.0803 | 2 |
| Target2 | 450 | 150 | 8.4300 | 3 |
| Target3 | 450 | 200 | 10.629 | 4 |
| Target4 | 400 | 100 | 6.564 | 1 |

Figure 4:
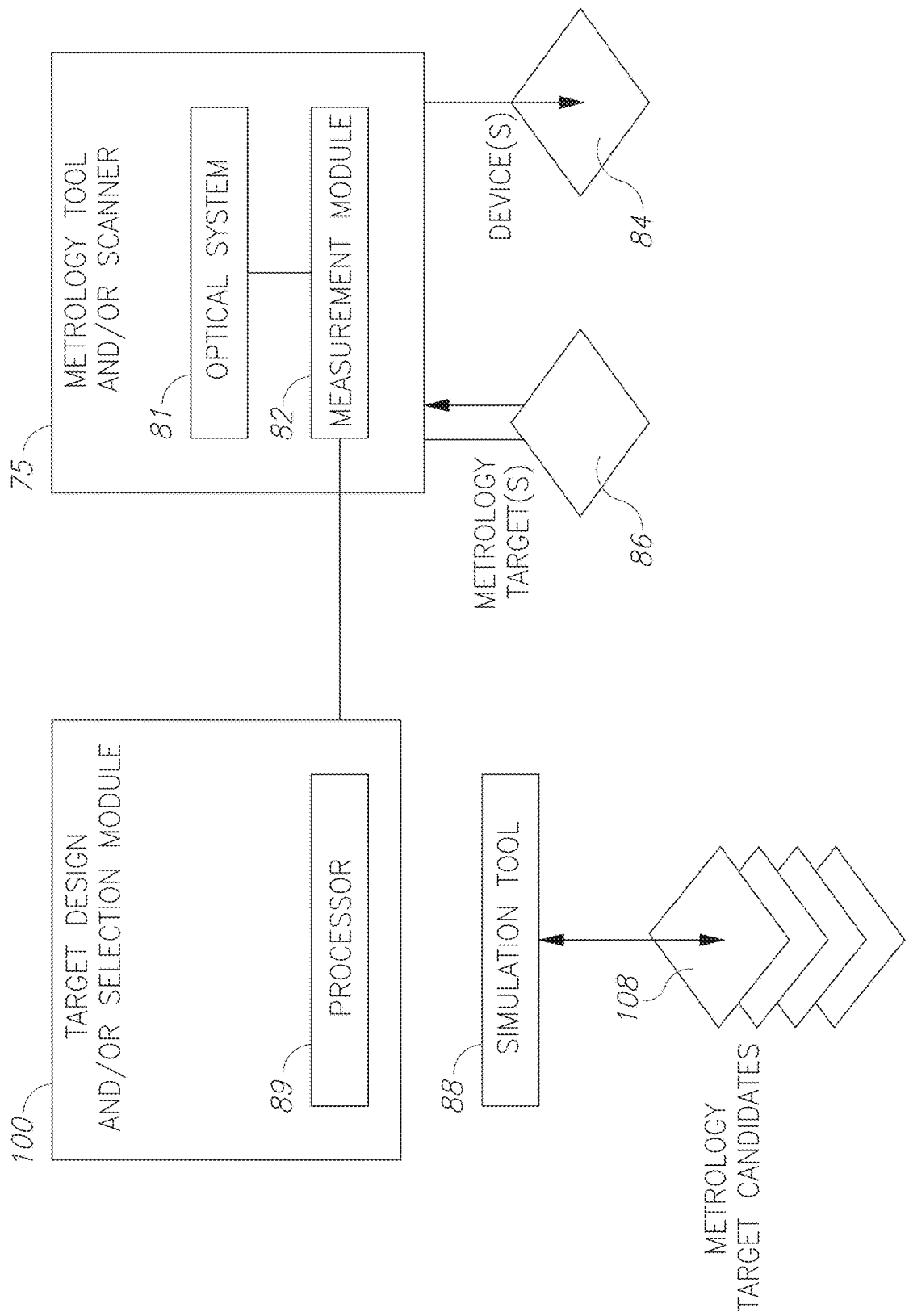
FIG. 4 is a high level schematic block diagram of a metrology module for target design and/or selection, in a metrology system, according to some embodiments of the invention.

FIG. 4 is a high level schematic block diagram of a metrology module 100 for target design and/or selection, in a metrology system, according to some embodiments of the invention. Metrology module 100 may be associated with a metrology tool and/or a scanner 75 having an optical system 81 and a measurement module 82 configured to produce devices 84 and measure metrology targets provided by metrology module 100 as explained below. Target design and/or selection module 100 comprises at least one computer processor 89 configured to calculate a Zernike sensitivity of pattern placement errors (PPEs) of at least one device design 84 and of a plurality of metrology target designs 108, and select a best metrology target design 86 according to a value of a cost function derived from the calculated Zernike sensitivities, the cost function quantifying a similarity of the Zernike sensitivity between at least one device design 84 and metrology target designs 108. Metrology target design and/or selection module 100 may be configured to implement any of the target design and/or selection methods described herein. Metrology targets designed by metrology module 100 and their target design files are likewise port of the present disclosure.

FIG. 5 is a high level schematic flowchart of a method 150 of target design and/or selection, according to some embodiments of the invention. Steps of method 150 may be used in any other method described herein. Certain embodiments comprise computer program products comprising a computer readable storage medium having computer readable program embodied therewith and configured to carry out of the relevant stages of method 150. Certain embodiments comprise target design files of respective targets designed by embodiments of method 150.

Method 150 may comprise calculating a Zernike sensitivity of pattern placement errors (PPEs) of at least one device design and of a plurality of metrology target designs (stage 160), e.g., according to Equation 1, and selecting a best metrology target design according to a value of a cost function derived from the calculated Zernike sensitivities (stage 170), e.g., according to Equation 2. The cost function may be defined (stage 165) to quantify a similarity of the Zernike sensitivity between the at least one device design and the plurality of metrology target designs. At least one of calculating 160 and selecting 170 may be carried out by at least one computer processor (stage 190), e.g., processor 89. The Zernike sensitivity may be calculated with respect to Zernike coefficients $Z4 \ldots Z36$; with respect to odd Zernike coefficients only; or with respect only to Zernike coefficients $Z8$, $Z11$, $Z15$, $Z20$, $Z24$, $Z27$, $Z31$, and $Z35$. The cost function may comprise a distance metric between the PPE Zernike sensitivity of the at least one device design and the PPE Zernike sensitivity of the plurality of metrology target designs.

Monte Carlo Zernike Analysis

Certain embodiments provide Zernike sensitivity analysis under larger aberrations, e.g., when the linear approximation conditions of FIG. 3A do not hold. The disclosed methods enable target optimization for larger Zernike drifts in lens aberrations or in the absence of accurate lens aberration data but merely temporal and spatial signatures. Such Zernike drifts may be caused e.g., by lens heating due to extreme off-axis illuminations which is a serious problem, especially in the advanced technology nodes. In addition, the disclosed methods provide robust analysis and enable target optimization for cases in which lens aberration varies among lots, wafers and slits.

Monte Carlo (MC) method may be used to optimize the target under strong Zernike variation. Analyzing the Zernike drift via Monte Carlo sampling also enables to extend the optimization to alternative devices and provides target statistics. Using MC enables device-like-target optimization without prior knowledge about the aberration fingerprint from the lithography scanner, yielding more accurate targets, as described below.

Figure 6:
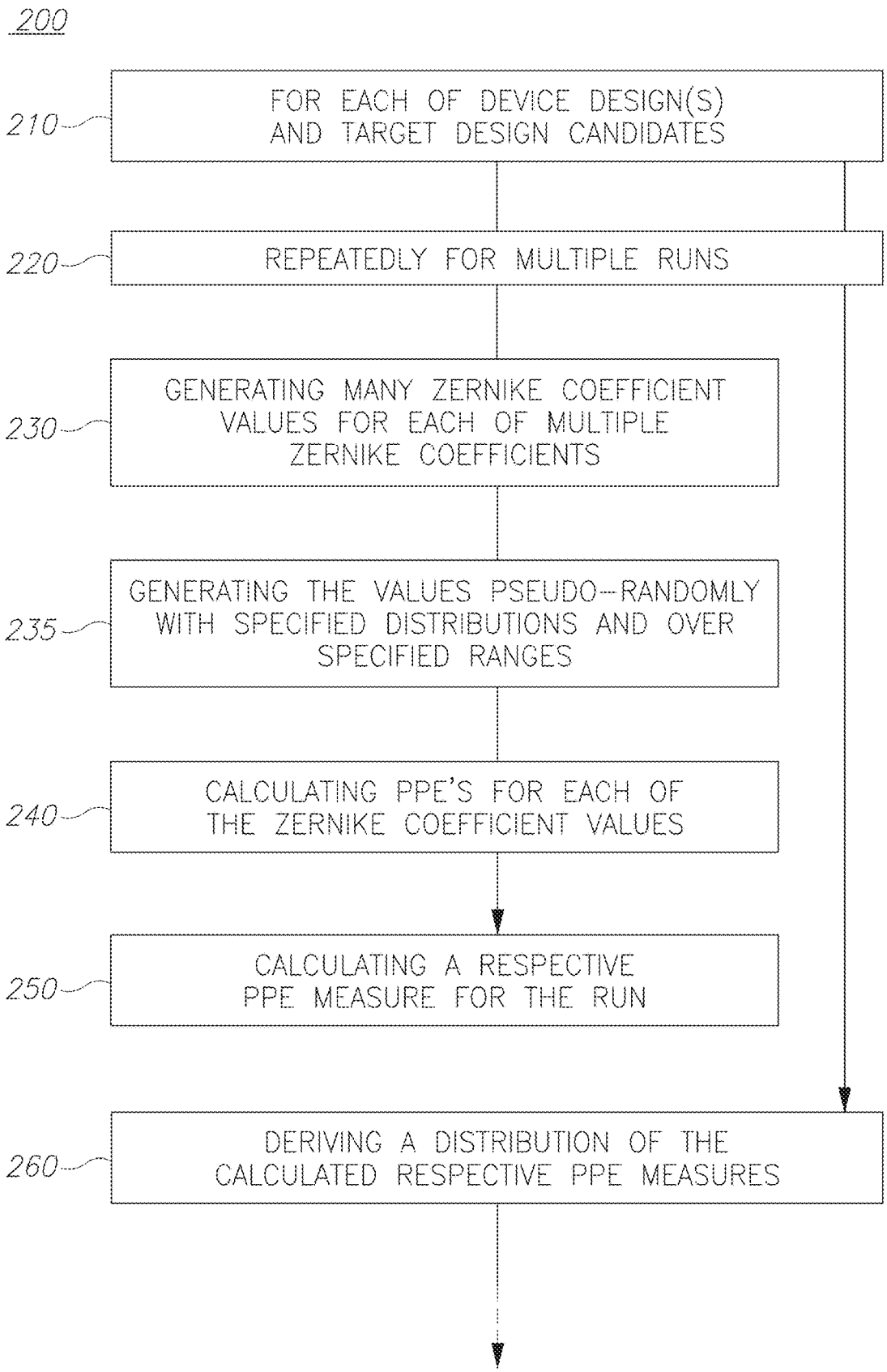

FIG. 6 is a high level schematic flowchart of a method 200 of target design and/or selection, according to some embodiments of the invention. Steps of method 200 may be used in any other method described herein. Certain embodiments comprise computer program products comprising a computer readable storage medium having computer readable program embodied therewith and configured to carry out of the relevant stages of method 200. Certain embodiments comprise target design files of respective targets designed by embodiments of method 200.

Method 200 comprises, for each of at least one device design and a plurality of target design candidates (stage 210): repeatedly for a plurality of runs (stage 220): generating a plurality of $N_i$ ($N_i>100$) Zernike coefficient values for each of a plurality of Zernike polynomials $Z_i$ (stage 230), calculating PPEs for each of the Zernike polynomials (stage 240), and calculating a respective PPE measure for the run (stage 250). The values may be generated pseudo-randomly with respect to specified distributions (e.g., uniform distributions) over specified ranges (e.g., corresponding to lens aberration tolerances defined in a specification) (stage 235). For each plurality of runs, method 200 comprises deriving a distribution of the calculated respective PPE measures (stage 260). Method 200 then comprises correlating each of the derived target design candidate distributions with the at least one derived device design distribution to yield for each target design candidate a device correspondence measure (stage 265); and selecting a best metrology target design according to the derived device correspondence measures (stage 270). At least one of generating 230, 235 calculating 240, 250, deriving 260, correlating 265 and selecting 270 may be carried out by at least one computer processor (stage 290), e.g., by processor 89.

Method 200 may further comprise selecting the target design candidates to represent segmentation alternatives of a specified target design (stage 275) and ranking the segmentation alternatives using the device correspondence measure (stage 276). Method 200 may further comprise carrying out the calculating stages (240 and/or 250) in parallel to a metrology simulation process (stage 280) and integrating a ranking using the device correspondence measure with a ranking derived from the metrology simulation process (stage 282). Method 200 may further comprise carrying out the method for multiple device designs (stage 285) and carrying out the selecting (270) with respect to the device correspondence measures derived for all the device designs (stage 286). Optionally, selecting 270 may be carried out with respect to a robustness measure, derived from the multiple device correspondence measures (stage 288).

Method 200 may be carried out by metrology module 100 (see FIG. 4). Metrology module 100 comprises at least one computer processor 89 which may be configured to, for each of at least one device design and a plurality of target design candidates: (i) repeatedly for a plurality of runs: generate a plurality of $N_i$ ($N_i>100$) Zernike coefficient values for each of a plurality of Zernike polynomials $Z_i$, the values generated pseudo-randomly with respect to specified distributions over specified ranges, calculate PPEs for each of the Zernike polynomials, and calculate a respective PPE measure for the run; and derive a distribution of the calculated respective PPE measures; (ii) correlate each of the derived target design candidate distributions with the at least one derived device design distribution to yield for each target design candidate a device correspondence measure; and (iii) select a best metrology target design according to the derived device correspondence measures.

Metrology module 100 may be further configured to select the target design candidates to represent segmentation alternatives of a specified target design and optionally to rank the segmentation alternatives using the device correspondence measure. Metrology module 100 may be further configured to carry out the calculating stages in parallel to a metrology simulation process and to integrate a ranking using the device correspondence measure with a ranking derived from the metrology simulation process. Metrology module 100 may be further configured to use multiple device designs and select the best target with respect to the device correspondence measures derived for all the device designs, and optionally to select the best target with respect to a robustness measure, derived from the multiple device correspondence measures. Metrology targets designed by metrology module 100 and their target design files are likewise port of the present disclosure.

Figure 7:
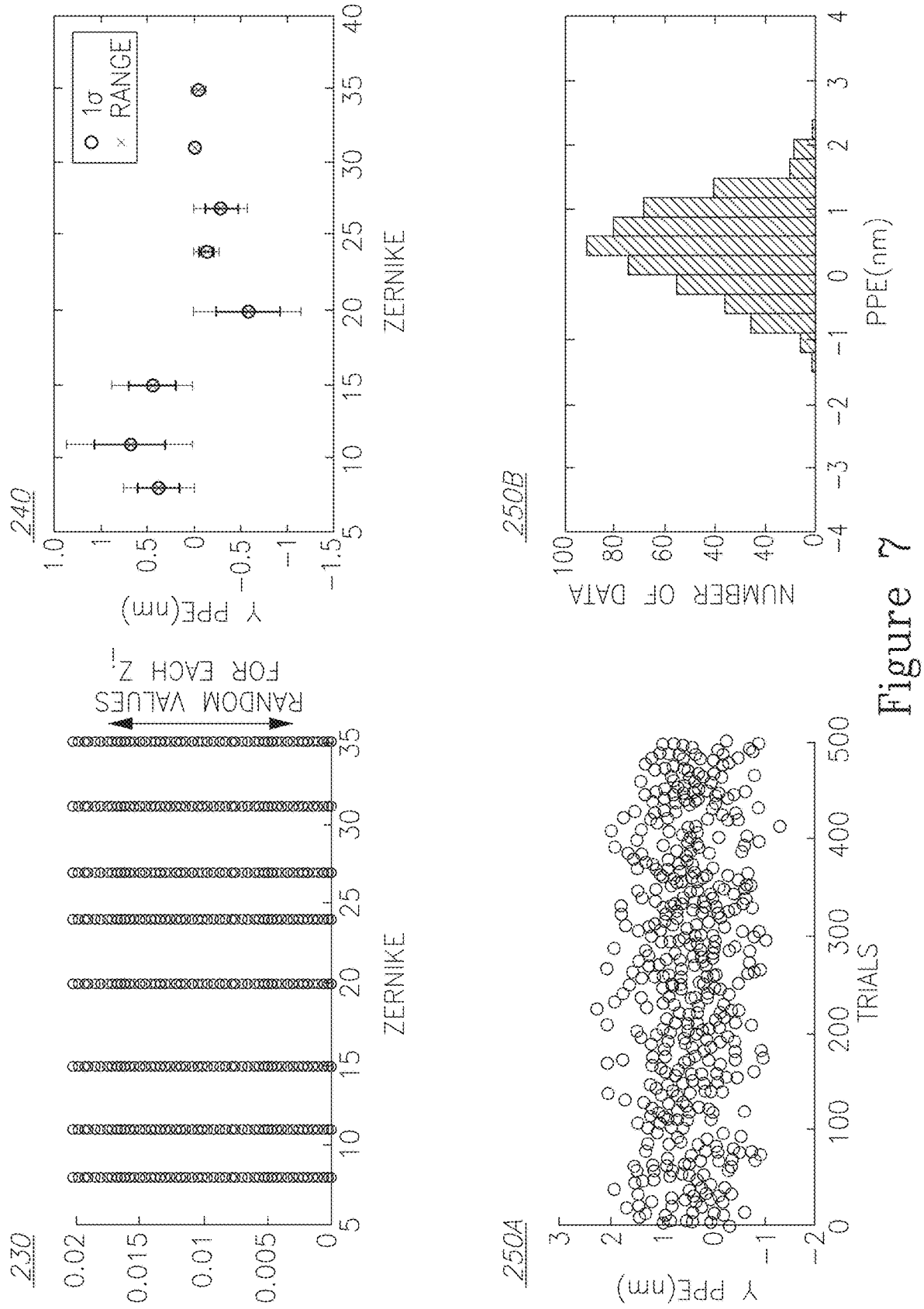
FIG. 7 is an illustrative example for Monte Carlo analysis stages of a method, according to some embodiments of the invention.

FIG. 7 is an illustrative example for Monte Carlo analysis stages of method 200, according to some embodiments of the invention. In the example the non-limiting parameters are used: Pitch=100 nm, CD=50 nm, N=500, range between 0 and 20 mWaves and use of terms Z8, Z11, Z15, Z20, Z24, Z27, Z31, and Z35. Generating 230 is demonstrated by generating a larger number (N, e.g., N=$\Sigma N_i$=500) of uniformly distributed pseudorandom coefficients from the realistic range of the interest for each Zernike terms (e.g., between 0 and 0.02λ, terms Z8, Z11, Z15, Z20, Z24, Z27, Z31, and Z35). Calculating PPEs 240 is demonstrated by calculating Y-PPE($Z_i$) (as a non-limiting example, alternatively X-PPE or both) per each Zernike term ($Z_i$) and calculating statistics such as mean, standard deviation, and range for each Zernike term. Calculating PPE measures 250 is demonstrated by calculating Y-PPE(Z) per each MC run 250A that may be the summation of Y-PPE($Z_i$) for i=4 ... 36 in Equation 1 and calculating the statistics for total N samples 250B, and of which may be used as the PPE measure. After repeating stages 230-250 for multiple runs 220 for each metrology target candidate, deriving the PPE measure distribution 260 and correlating the targets with the device 265 may be carried out by computing correlation coefficients R and mean differences between the device and the target or by directly computing PPE differences between device and target. The PPE measure may be calculated based on known statistical correlation parameters such as $R^2$, 3 sigma, slope or intercept.

FIG. 7 further illustrates the correlations (265) of the derived distributions for the device and each target candidate T1 ... T4 defined in Table 1, and their statistics and ranking are summarized in Table 2. As illustrated in the correlated distribution, method 200 may be used to provide a detailed comparison of various target candidates and device designs under varying conditions and without the assumption of linear Zernike sensitivity.

TABLE 2

Statistics for the device and four different scatterometry target candidates with the Monte Carlo method. All target candidates are ranked based on the correlation coefficient value and mean difference.

|  | Mean (nm) | 1 sigma (nm) | Range (nm) | Delta (mean) | R, correlation | Rank |
| --- | --- | --- | --- | --- | --- | --- |
| Device | 0.046 | 0.657 | 3.527 |  |  |  |
| Target 1 | 0.123 | 0.996 | 5.35 | 0.077 | 0.648 | 2 |
| Target 2 | −0.0205 | 1.087 | 5.742 | 0.066 | 0.547 | 3 |
| Target 3 | −0.3448 | 1.15 | 6.014 | 0.391 | 0.364 | 4 |
| Target 4 | 0.0788 | 0.978 | 5.22 | 0.033 | 0.703 | 1 |

Certain embodiments may implement method 200 to any number of candidate targets, device designs, to imaging targets and well as to scatterometry targets, and to simple or complex two dimensional devices and targets as well. Any parameter values of the simulations (conditions, runs, etc.) may be set, depending on the given circumstances.

Figure 8:
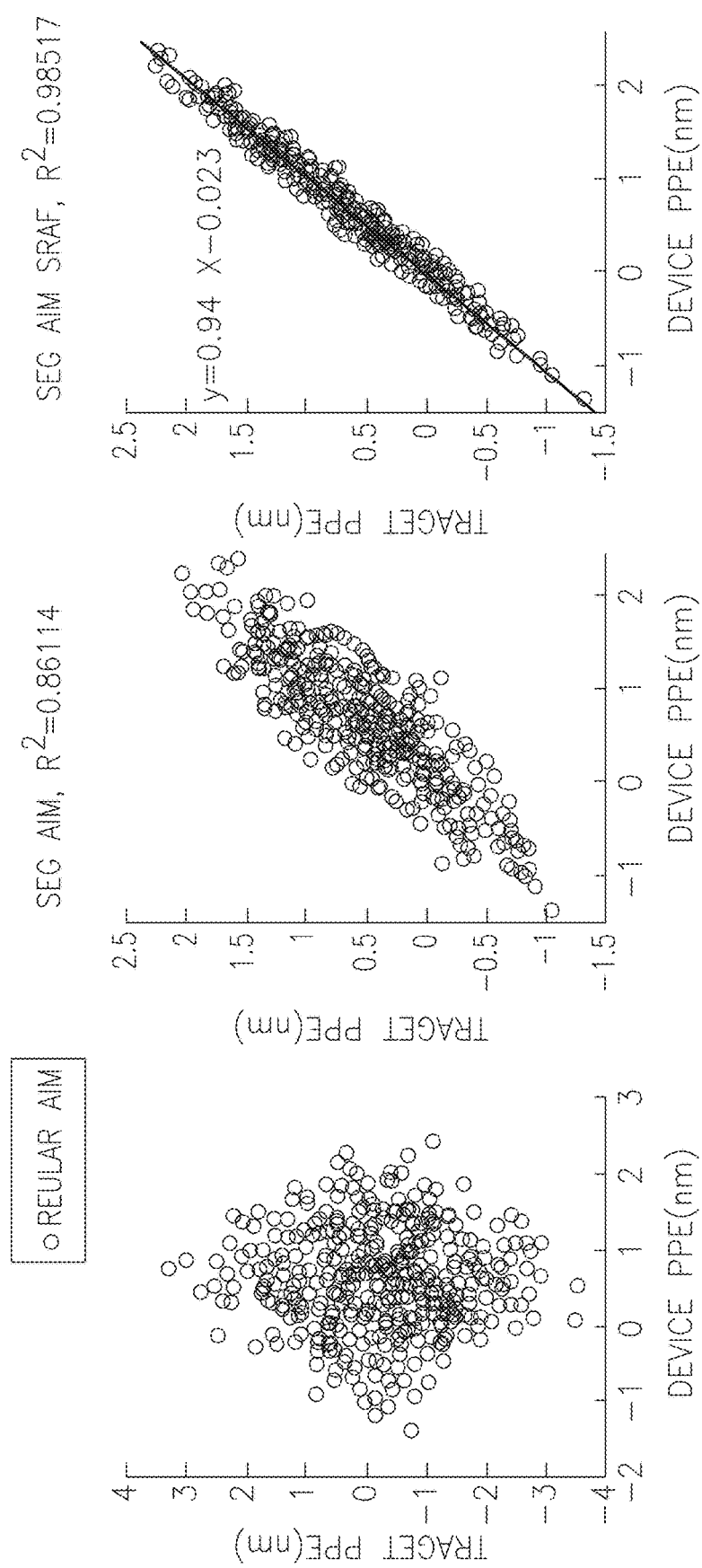
FIG. 8 is an illustrative example for Monte Carlo analysis stages of the method, applied to a regular and two different segmented AIM (advanced imaging metrology) target designs, according to some embodiments of the invention.

FIG. 8 is an illustrative example for Monte Carlo analysis stages of method 200, applied to a regular and two different segmented AIM (advanced imaging metrology) target designs, according to some embodiments of the invention. Device CD and pitch were used for the segmented targets as segmentation CD and pitch. A first segmented target does not have assist features while the second segmented target uses two sub-resolution assist features (SRAF), one located next to the top segmented line and another located next to the bottom segmented line. The statistics and correlation coefficients are computed from propagating diffraction orders through the lithographic lens with random aberration using Monte Carlo method 200. The PPE values for the segmented AIM target with SRAF, under the given 500 random aberrations, are nearly identical to those obtained in the device, resulting in the strong correlation R=0.985, probably due to the good matching of the amplitude and phase distribution of the diffraction orders at the lens exit pupil between the segmented AIM target and the devices. However, as expected no correlation is observed between the device and the regular AIM target because of large dimensional difference between them. FIG. 8 presents the =correlations (265) of the derived distributions for the device and the three target candidates. The non-limiting data and the resulting correlation coefficients and ranking are presented in Table 3.

TABLE 3

Statistics for the device and three different AIM target candidates with the Monte Carlo method. Target candidates are ranked based on the correlation coefficient value.

|  | Pitch (nm) | CD (nm) | R | Rank |
| --- | --- | --- | --- | --- |
| Device | 128 | 54 |  |  |
| Regular AIM | 1500 | 750 | 0.013 | 3 |
| Segmented AIM | Macro P = 1500, Segmented P = 128 | 54 | 0.861 | 2 |
| Segmented AIM, with SRAF | Macro P = 1500, Segmented P = 128 | 54 | 0.985 | 1 |

Advantageously, method 150 and particularly method 200 (i) minimize the need for input of exact aberration characteristics of the scanner lens, (ii) ensure a more lithographically-robust target design as a large variety of scanner lens aberration pattern alternatives may be considered in the selection process and (iii) quantify the correlation between device(s) and targets under conditions of variable lens aberrations. For example, the AIM segmentation scheme was shown to improve the device and target correlation to over 98%.

Certain embodiments comprise lens-aberration-aware imaging-based overlay target optimization methods for tilted patterns in memory active layer. These methods provide metrology solutions for measuring tilted device, i.e., devices having pitches along directions that are tilted with respect to the X and Y axes of the metrology targets.

Figure 9:
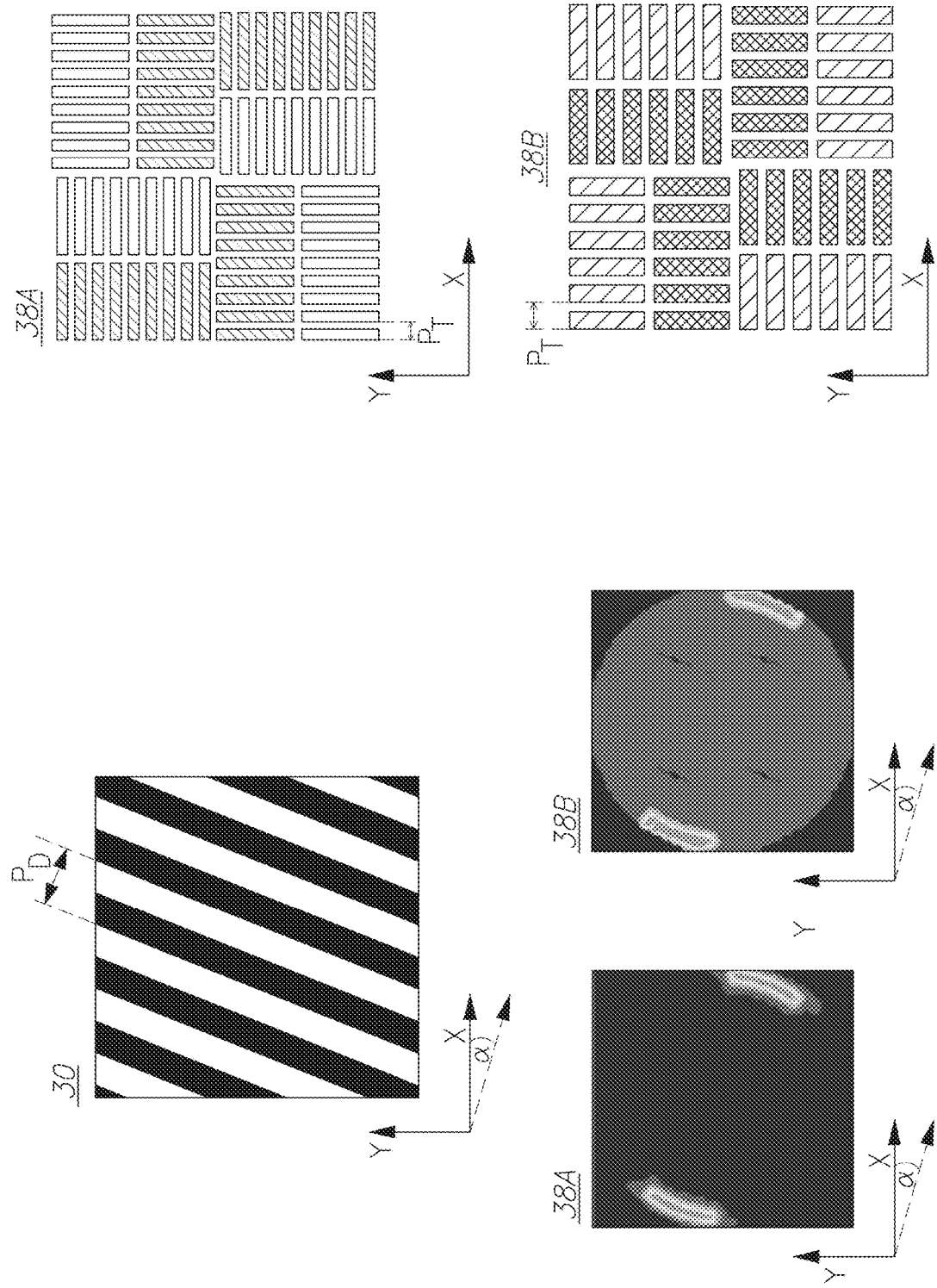
FIG. 9 is a high level schematic illustration of device design, of illumination conditions used to produce such devices and of typical imaging metrology targets, according to the prior art.

FIG. 9 is a high level schematic illustration of device design 30, of illumination conditions 35A, 35B used to produce such devices and of typical imaging metrology targets 38A, 38B, according to the prior art. Memory active layer devices 30 are generally composed of rotated lines and spaces (LS) at the pitch device $P_D$ (typical pitch $P_D$=80 nm and CD=40 nm), and are produced by optimized illumination source such as rotated dipole X illumination having its poles and tilting angle α configured according to device pitch and requirements. Pupil plane illumination 35A is shown at the source and pupil plane 35B is shown at the exit pupil, with diffraction orders 0 and 1 overlapping per design to optimize the printing process of the device. The tilt of device design 30 and the rotation of the illumination are indicated schematically by the angle α. Prior art targets are aligned along the horizontal and vertical directions (X and Y), as taught e.g., by U.S. Pat. Nos. 7,408,642 and 7,667,842 for targets 38A (standard AIM target, $P_T$ typically 1600-2000 nm) and 38B (segmented AIM target, see above) respectively, incorporated herein as prior art by reference in their entirety. The discrepancy in target directions results in printability issue and placement error, e.g., as described above regarding lens aberrations (see also corresponding device illumination 85 in FIG. 2 versus target illumination 95). It is noted that prior art segmented metrology target designs are carried out to optimize metrology performance (e.g., contrast, diffraction efficiency, and precision), see e.g., Leray et al. 2015, "Overlay metrology solutions in a triple patterning scheme". SPIE Vol 9424 94240E, which is incorporated herein as prior art by reference in its entirety.

Certain embodiments comprise target design methods that incorporate lithography effects into target design considerations and allow judicious determination of segmentation pitches, critical dimensions and other parameters of the metrology targets. Advantageously, disclosed methods enable: (i) improvement of overlay measurements that may contribute to increased yield, (ii) overcoming of lens heating issues due to optimized illumination source which result in pattern placement error (also see above), (iii) selection of segmentation schemes which comply with the optimized (rotated) illumination, (iv) reducing the large PPE offset due to the difference between the location of the diffraction orders and the difference in PPE sensitivity to Y-odd aberration terms, the latter being strong in the devices (due to tilted design) and non-existent in the targets, (v) overcoming the smaller process window for targets using device segmentation (see below), and (vi) deriving an optimized target pitch, taking into account both the device pitch and the tilting of the tilted LS patterns with tilted extreme dipole source.

Figure 10:
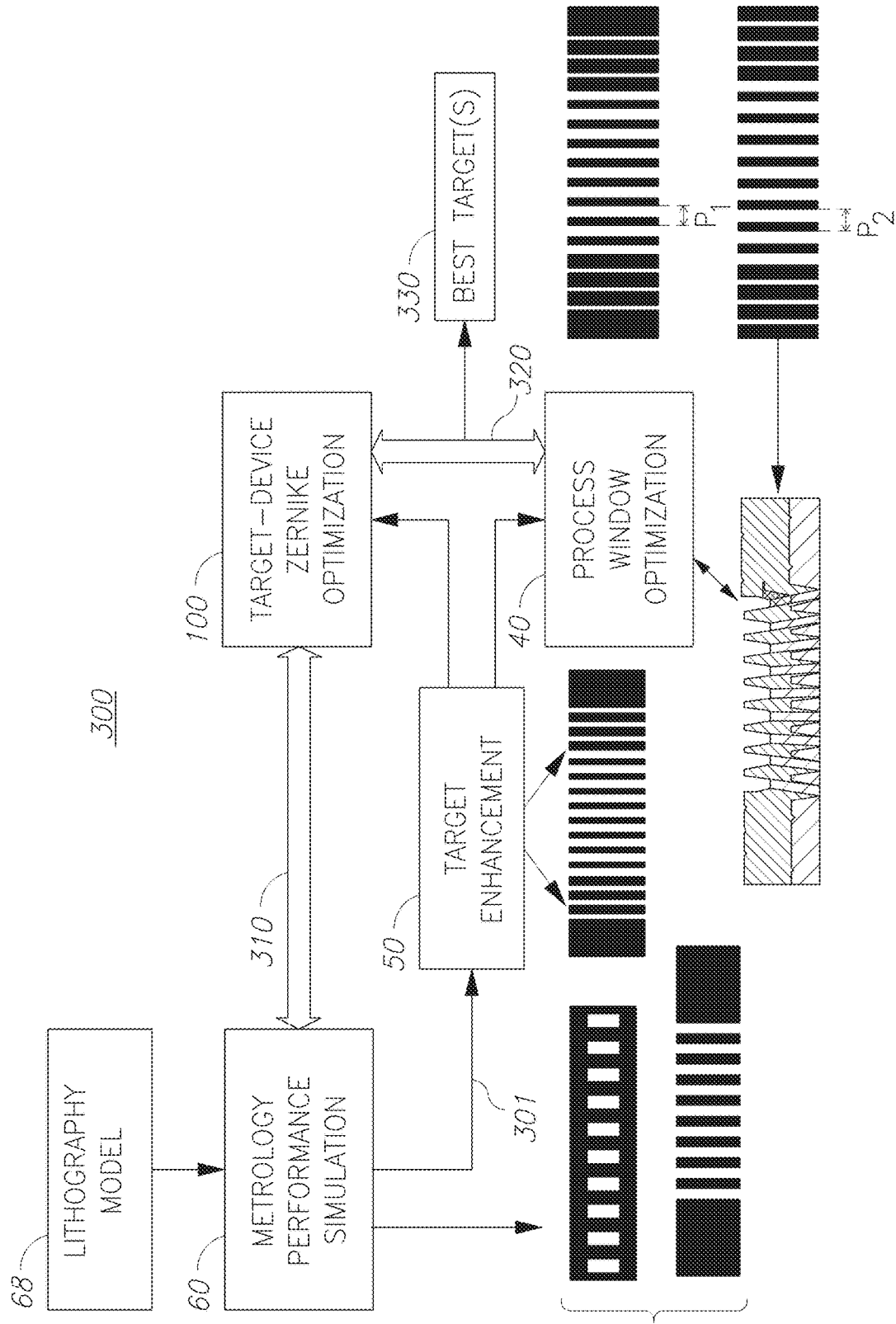
FIG. 10 is a high level schematic block diagram of a system 300 of target design and/or optimization, according to some embodiments of the invention.

FIG. 10 is a high level schematic block diagram of a system 300 of target design and/or optimization, according to some embodiments of the invention. Any of the elements illustrated in FIG. 10 may be implemented as a module associated with a computer processor in a metrology tool and/or as computer readable storage medium having computer readable program embodied therewith and configured to implement the respective operations described below.

System 300 comprises a lithography model 68 which is used for a metrology performance simulation 60 with respect to metrology parameters such as contrast, precision and diffraction efficiency (in SCOL), exemplary segmented target elements (single bars when relating to FIG. 9) are shown below simulation module 60. The designed target(s) are then enhanced 50, e.g., by applying OPC (Optical proximity correction) and SRAF (and/or other segmentation). An exemplary enhanced target element is shown, with SRAF segmentation indicated by the arrows. The enhanced targets are then optimized with respect to their Zernike sensitivity 100 (as described above, and elaborated below) and may also be optimized with respect to their process window 40, e.g., with respect to DOF (depth of focus) and EL (exposure latitude). These two optimizations may be carried out relatedly 320 and correspondingly 310 with additional metrology performance simulation 60 to yield optimized targets 330 with respect to all three sets of considerations, e.g., targets having a segmentation pitch selected based on (i) minimum PPE offset (from 100), (ii) maximal process window (from 40) and (iii) maximal metrology performance (from 60). System 300 is configured to calculate the optical segmentation pitch while improving both target printability (i.e., larger process window) on the wafer and device-to-target matching by reducing the placement error offset between the target and the device. The designed overlay targets can be used for both ADI (after develop inspection) and AEI (after etch inspection) levels.

Segmentation generally increases the process window and disclosed methods provide optimization of the segmentation pitch and design. For example, typical coarse pitch of the target, with respect to the bar elements of FIG. 9 is typically 1500 nm, which segmentation pitches may range e.g., between 80-100 nm. Any value on this range provides different targets with different petrology and process parameters.

Figure 11A:
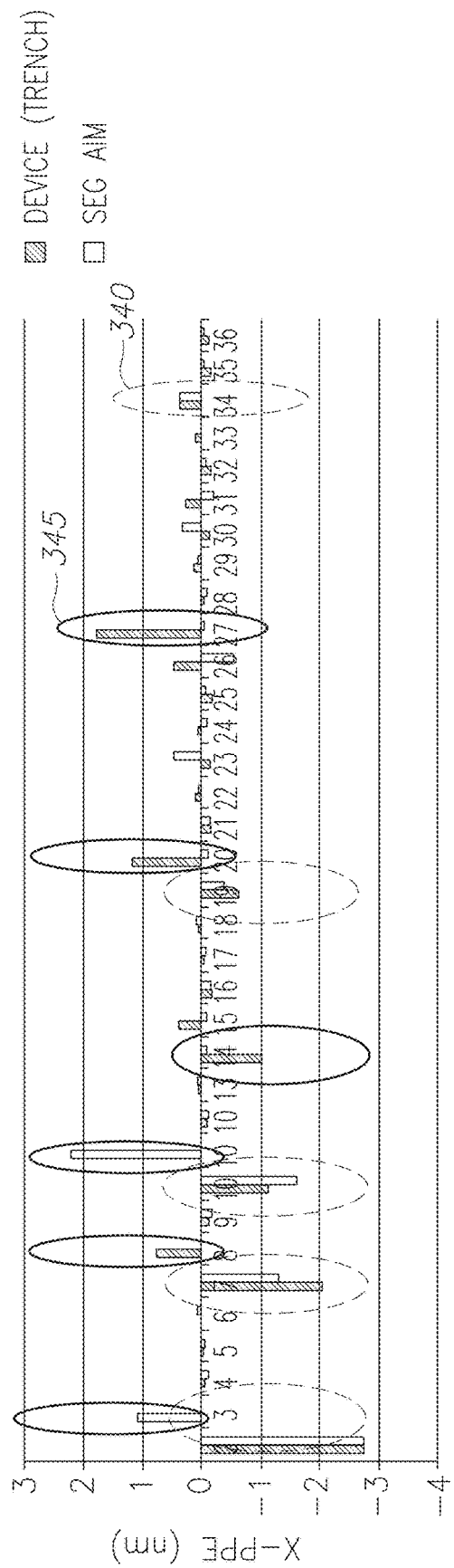
FIGS. 11A and 11B present an exemplary comparison of different target designs, each compared with the same device with respect to their Zernike sensitivity, according to some embodiments of the invention.
Figure 11B:
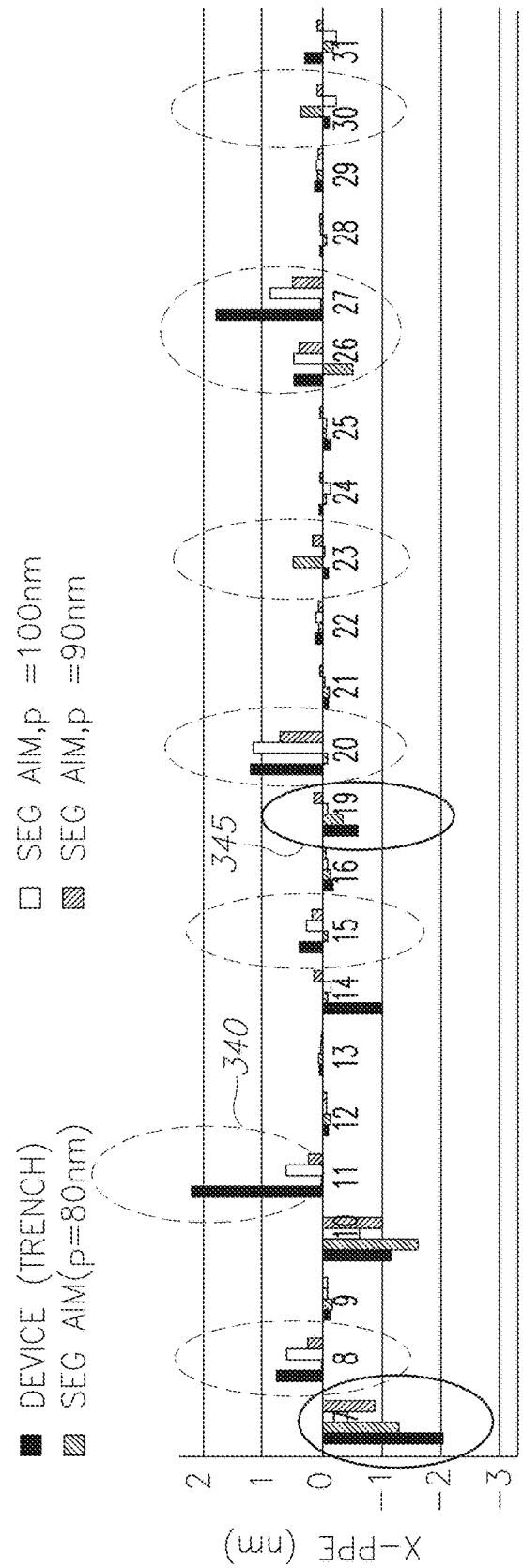

FIGS. 11A and 11B present an exemplary comparison of different target designs, each compared with the same device with respect to their Zernike sensitivity, according to some embodiments of the invention. In both cases the device pitch is 80 nm, CD=40 nm and a constant Z coefficient of 20 mWaves is used. In FIG. 11A the target segmentation has the same pitch as the device (80 nm), while in FIG. 11B target segmentation pitches are different from the device pitch (90 nm and 100 mm; 80 nm targets are included for comparison). Both figures present the device and target simulated PPE's according to the Zernike terms, with good correspondence between target and device sensitivity denoted 340 and good correspondence between target and device sensitivity denoted 345 (in FIG. 11A the notation relates to the 80 nm target while in FIG. 11B the notation relates to the 90 nm and 100 nm targets). The terms that contribute most to the PPE in FIG. 11A are X-odd aberration terms Z14 and Z26, and Y-odd aberration terms Z3, Z8, Z11, Z20 and Z27. The latter characterize the device PPE sensitivity to Y-odd aberration due to its tilted orientation, as explained in more details below.

It is noted that using the device pitch for target segmentation (FIG. 11A) results in a lower correspondence between the sensitivities of the device and the target than using pitches different from the device pitch for target segmentation (90 nm and 100 nm targets in FIG. 11B). This result is surprising, as the common practice is segmenting the metrology targets at the same pitch as the device.

Table 4 provides a comparison between the target segmentation pitches with respect to the device target matching (100) and process window parameters (40), showing optimal results for target segmentation pitch of 100 nm, which is 25% larger than the device pitch. The 100 nm segmented target has both better device matching, resulting in 35% PPE offset reduction, and a larger process window (PW), For targets with segmented pitch larger than 100 nm, overlap PW starts decreasing and the targets also become not SADP (Self-Aligned Double Patterning) process friendly, resulting in reduced target contrast in AEI level. The DOF is calculated at 5% exposure level (EL) for trenches in the design, left and right trenches having the same values. The process window parameters data is illustrated in more details in FIG. 15B.

TABLE 4

A comparison between the target segmentation pitches with respect to the device target matching and process window parameters (in bold - best target 330, Targets are segmentated AIM targets, with the denoted segmentation pitch).

| | PPE sensitivity or Zernike terms Z4 . . . Z36 | Process window parameters | |
|---|---|---|---|
| | Device-Target matching, ED | Center trench DOF | Left trench DOF |
| Device | | 272 nm | NA |
| Target, p = 80 nm | 3.79 nm | 248 nm | 72.8 nm |

TABLE 4-continued

A comparison between the target segmentation pitches with respect to the
device target matching and process window parameters
(in bold - best target 330, Targets are segmentated AIM targets,
with the denoted segmentation pitch).

| | PPE sensitivity or Zernike terms Z4 ... Z36 | Process window parameters | |
|---|---|---|---|
| | Device-Target matching, ED | Center trench DOF | Left trench DOF |
| Target, p = 90 nm | 3.16 nm | 296 nm | 134 nm |
| Target, p = 100 nm | 2.80 nm | 245 nm | 151 nm |
| Target, p > 100 nm | | Decrease in parameters and reduced contrast due to patterning effects | |

Figure 12B:
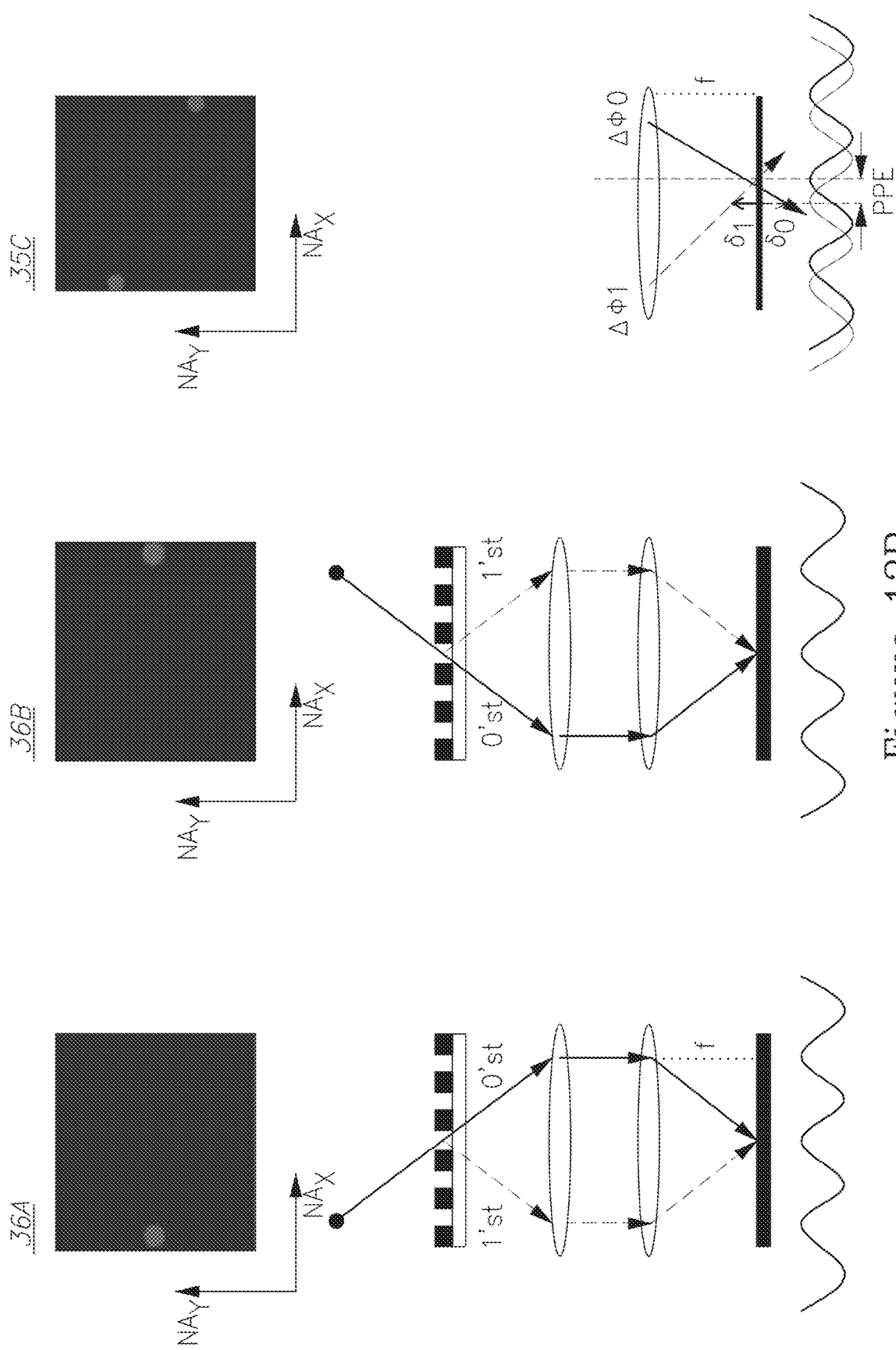
FIG. 12B is a high level schematic model of tilted illumination, according to some embodiments of the invention.
Figure 12C:
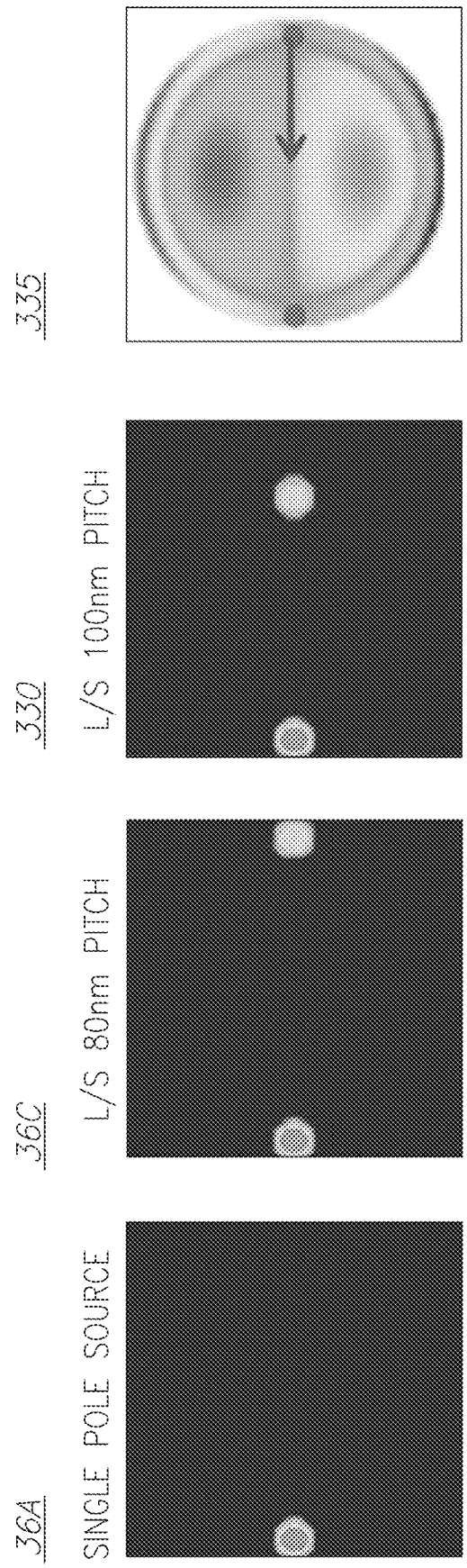
FIG. 12C is a high level schematic illustration of the effect of target pitch modification at the pupil plane, according to some embodiments of the invention.

The inventors have found out the sources for the improvement in the target design, which are illustrated below. FIGS. 12A-C schematically illustrate the lack of prior art target sensitivity to Y-odd aberrations, as illustrated in FIG. 11A, FIGS. 13A-C schematically illustrate the sensitivity of the improved targets to Y-odd aberrations, illustrated in FIG. 11B, FIG. 14 provides guidelines for improving of the matching between the target and the device and FIG. 15B illustrates the improved process window with respect to the prior art, illustrated in FIG. 15A.

FIG. 12A is a schematic illustration explaining the lack of prior art target sensitivity to Y-odd aberrations. FIG. 12A illustrates tilted illumination source 35A and device diffraction signal 35B at exit pupil, with congruent zeroth and first diffraction orders (see also FIG. 9), as well as the response of prior art metrology target 38B segmented at the same pitch as device 30 (80 nm for both), but not tilted. It is noted that due to the different orientation and same pitch, zeroth and first order diffraction signals do not overlap but spread over the pupil plane, changing the aberration sensitivity of target 38B with respect to device 30. In particular, while device 30 has large PPE sensitivity to Y-odd aberrations, prior art target 38B has a relatively small or no PPE sensitivity to Y-odd aberrations, because diffraction patterns for target 38B are aligned along x-direction, while device 30 provides diffraction patterns along the diagonal (tilted) direction.

FIG. 12B is a high level schematic model of tilted illumination 38A, according to some embodiments of the invention. Illumination 38A is simulated as comprising two point sources 35C. FIG. 12B schematically illustrates the paths of zeroth and first order diffraction signals from point sources 36A, 36B and the resulting phase difference causing the PPE when the metrology target is vertically oriented for the given rotated illumination 35C, because the first and zeroth diffraction orders travel different distances. The intensity of aerial imaging for single pole source is the square of the magnitude of electric field, as expressed in Equation 3.

$$I_\alpha(x) = \alpha_0^2 + \alpha_1^2 + 2\alpha_0\alpha_1 \cos(\Delta\varphi_1 + 2\pi x/p) \quad \text{Equation 3}$$

As the illumination source is optimized for the device parameters (in the example, pitch 80 nm and tilt ($\alpha$) of 21°), the first order diffraction signal passes through the location which is exactly opposite to zeroth order diffraction signal.

FIG. 12C is a high level schematic illustration of the effect of target pitch modification 335 at the pupil plane, according to some embodiments of the invention. FIG. 12C schematically illustrates illumination source 36A, zeroth and first order diffraction signals thereof for prior art target 36C and zeroth and first order diffraction signals for improved target 330, in which the position of the first order diffraction signal is moved from its former juxtaposed position with respect to the zeroth order diffraction signal. The effect of target pitch modification 335 is shown with respect to one of the Y-odd Zernike polynomials, $Z_3^{-1}$ (Z8), to illustrate the movement along the X axis of the first order diffraction signal. It is noted that while using X-direction illumination source 36A does not vary the sensitivity of target 330 in the Y direction, once the illumination source is tilted, modification 335 does result in Y-odd Zernike sensitivity for target 330, as illustrated in FIGS. 13A-C.

Figure 13A:
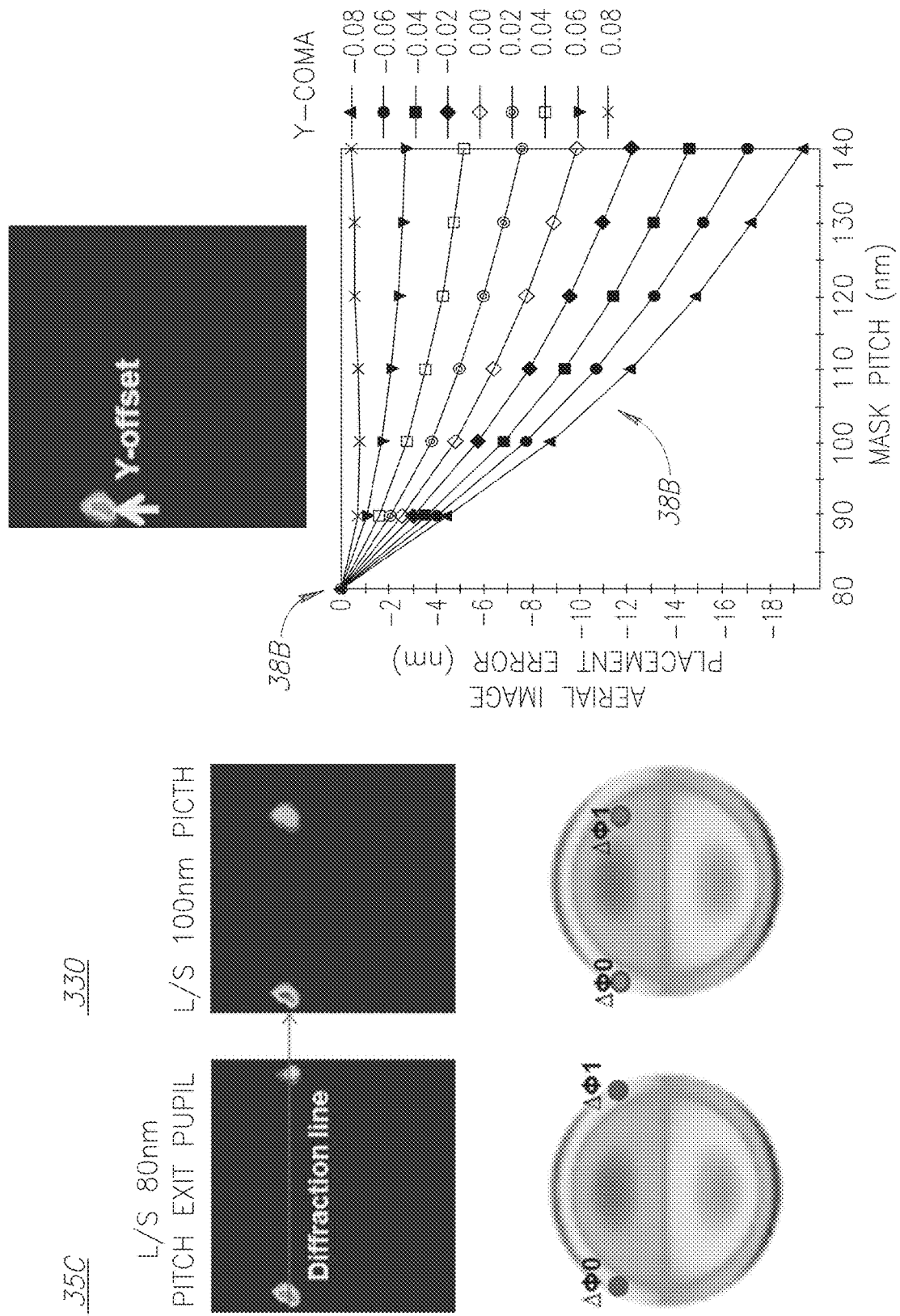
FIGS. 13A and 13B are high level schematic illustrations of the effect of target pitch modification at the pupil plane, according to some embodiments of the invention.
Figure 13B:
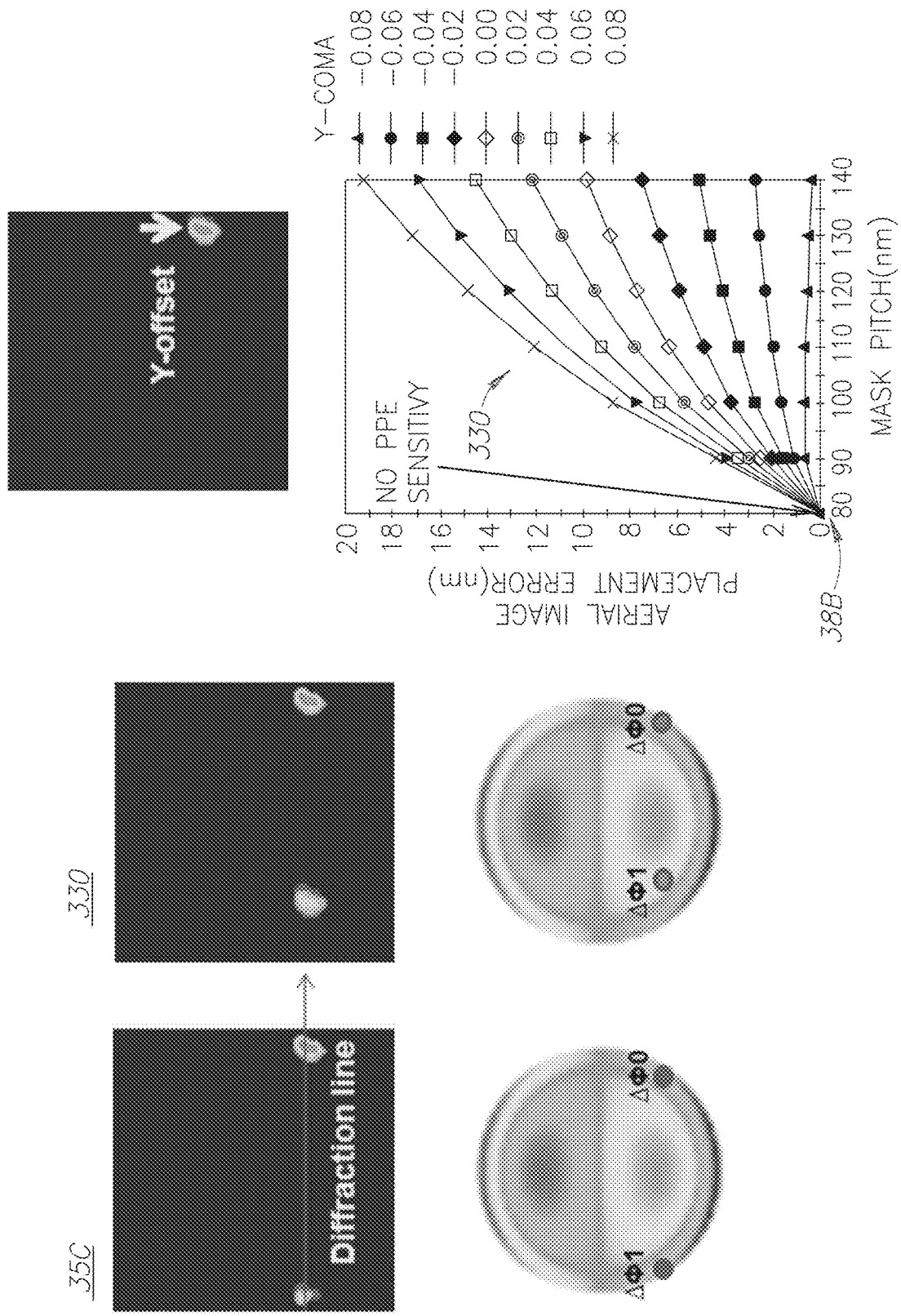
Figure 13C:
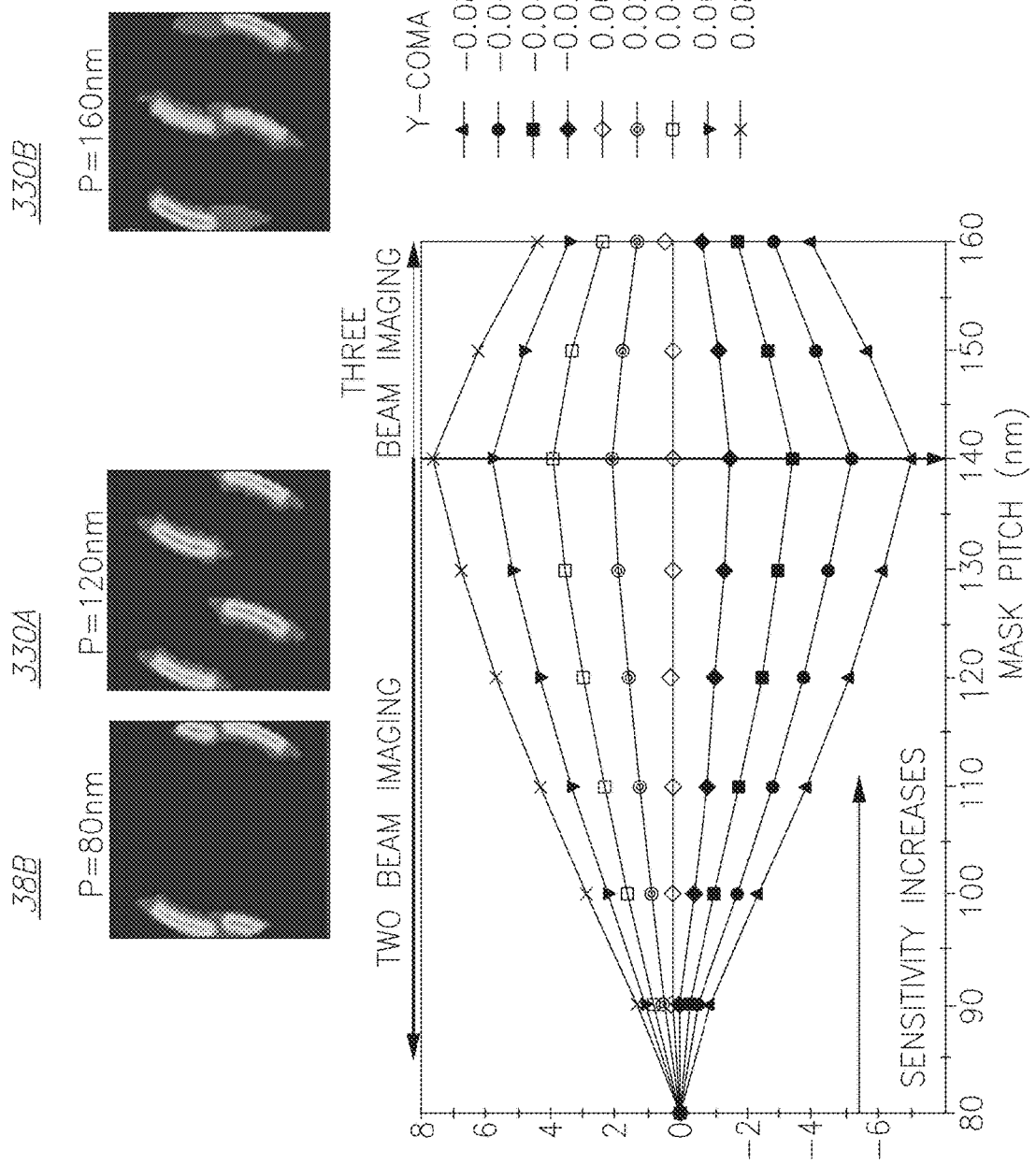
FIG. 13C is a high level schematic illustration of the effect of target pitch on PPE of different Y coma aberrations, according to some embodiments of the invention.
Figure 14:
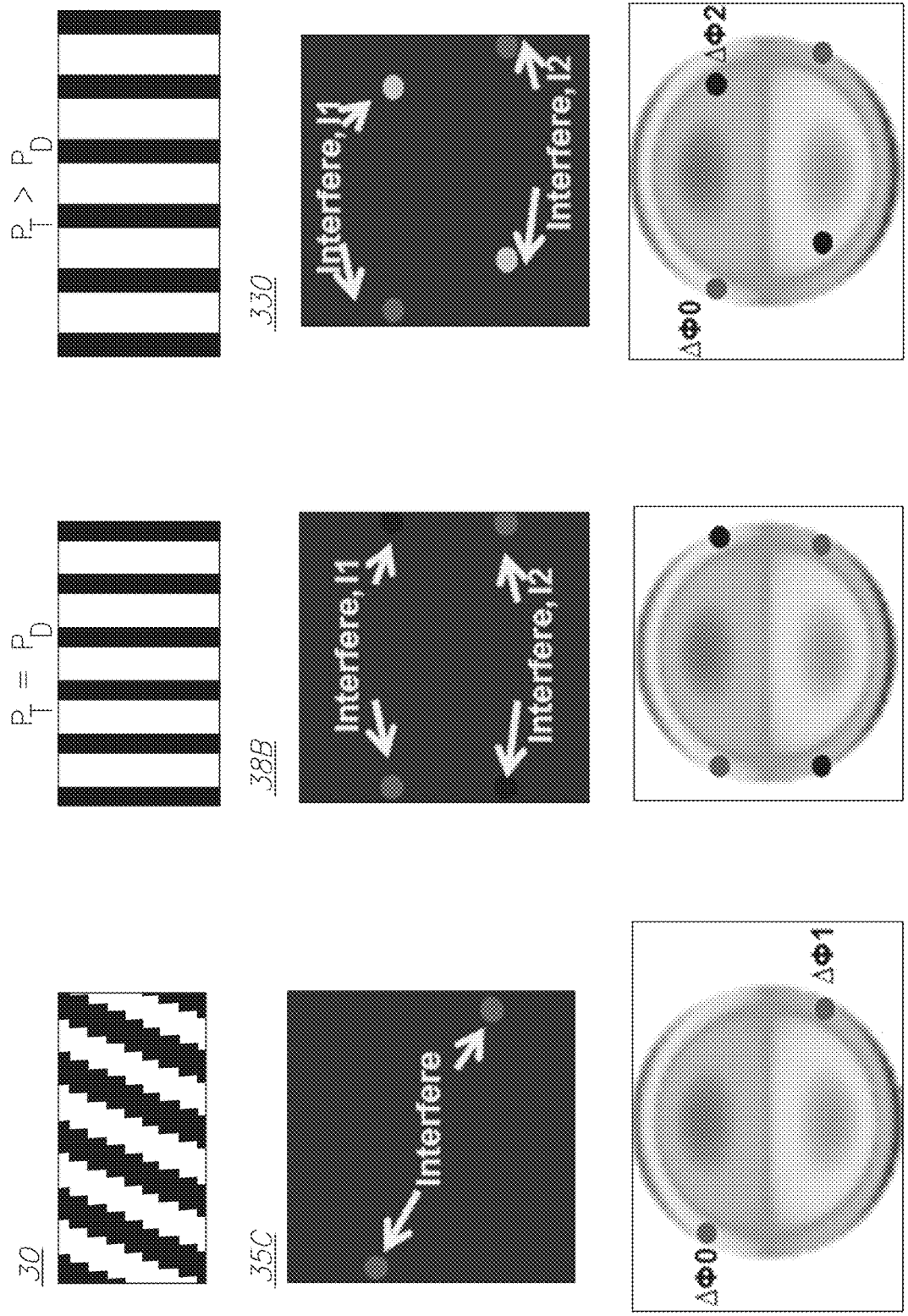
FIG. 14 is a high level schematic illustration of a suggested method to determine the target segmentation with respect to the device, according to some embodiments of the invention.

FIGS. 13A and 13B are high level schematic illustrations of the effect of target pitch modification 335 at the pupil plane, according to some embodiments of the invention. FIGS. 13A and 13B illustrate illumination source (single pole source, above the X axis in FIG. 13A, below the X axis in FIG. 13B) off the X axis with exit pupil images of prior art target 35C and improved target 330, illustrating the Y-odd Zernike sensitivity of the latter by the change of the position of the first order signal (denoted $\Delta\varphi_1$) on the Zernike polynomial from a position equivalent to the position of the zeroth order signal (denoted $\Delta\varphi_0$) shown at 35C ($\Delta\varphi_0 = \Delta\varphi_1$) to a position which is not equivalent to the position of the zeroth order signal $\Delta\varphi_0$ shown at 330 ($\Delta\varphi_0 \neq \Delta\varphi_1$), which is therefore sensitive to aberrations along the Y axis. The graphs in FIGS. 13A, 13B shows the dependence of the PPE on the target pitch for Y coma aberration variation (with respect to Z8), starting from zero PPE for prior art targets segmented at device pitch and increasing in PPE (and Zernike sensitivity) as the target segmentation pitch diverges from the device pitch (330). FIG. 13C is a high level schematic illustration of the effect of target pitch on PPE of different Y coma aberrations, according to some embodiments of the invention. Exemplary exit pupil images are shown for pitches 80 nm (device pitch, 38B), 120 nm (improved target 330A) and 160 nm (improved target 330B). The graph shows the increase in sensitivity with the target pitch diverging from the device pitch. The two beam imaging region represents the case when only zeroth and first diffraction orders are captured by the scanner lens array and those two beams interfere with each other. By increasing pitch, more diffraction orders can be captured. Three beam interference imaging applies when zeroth, first and second diffraction orders are captured and interfered with each other.

FIG. 14 is a high level schematic illustration of a suggested method 250 to determine the target segmentation with respect to the device, according to some embodiments of the invention. Simulated illumination source 35C for producing device 30 is calculated on the exit pupil with respect to at least one Zernike polynomial, e.g., Z8 and a corresponding calculation is carried out for prior art targets 38B with $P_T = P_D$. Then, the relative pupil plane positions of zeroth and first diffraction order signals ($\Delta\varphi_0$, $\Delta\varphi_1$) are analyzed and target parameters are modified (330) to provide relative pupil plane positions which correspond better to the relative device positions of zeroth and first diffraction order signals ($\Delta\varphi_0$, $\Delta\varphi_1$) in their relation to PPE sensitivity, reflected by the corresponding Zernike polynomial values.

Figure 15A:
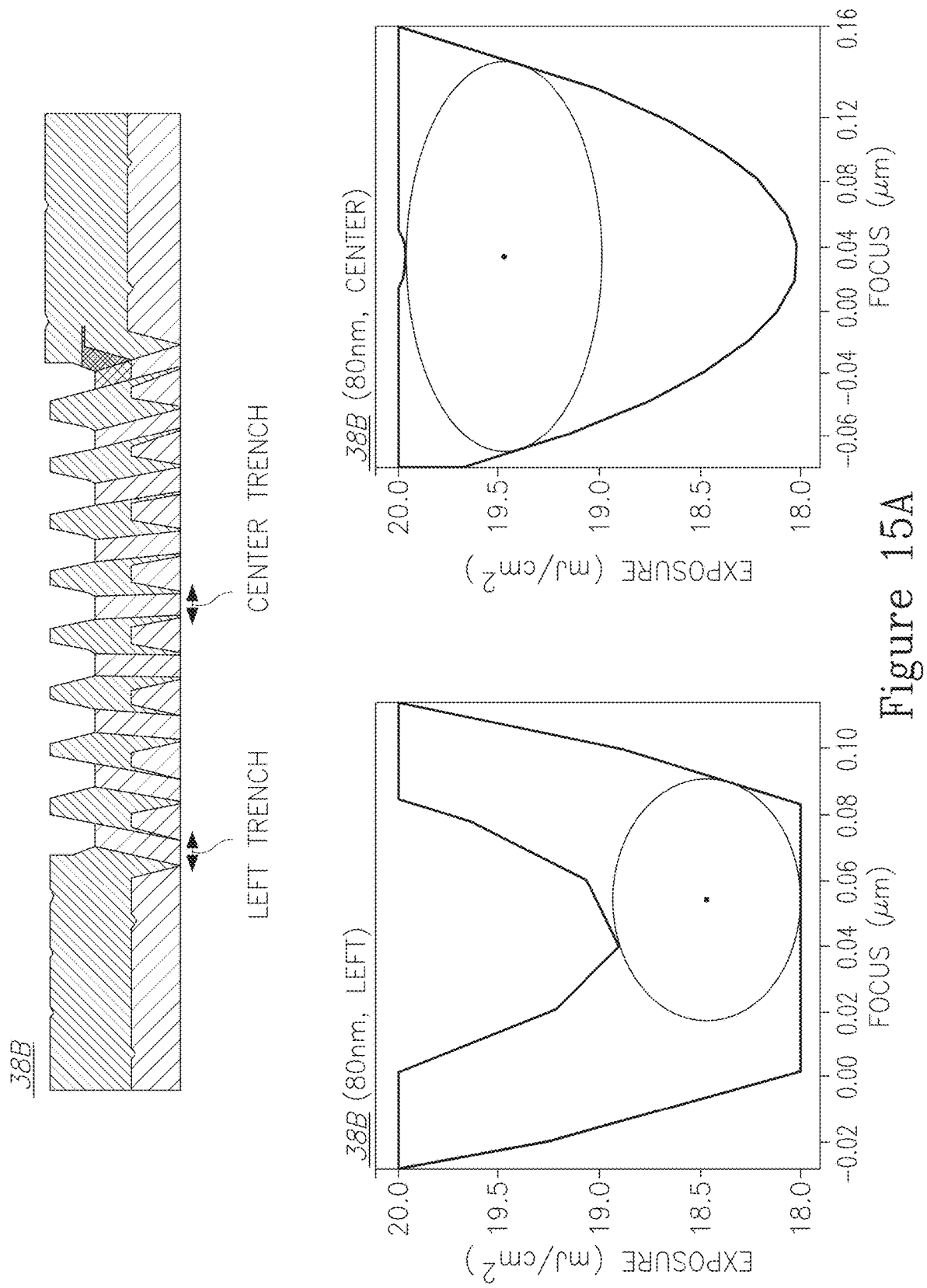
FIGS. 15A and 15B schematically illustrate a way for improving and optimizing the process window, according to some embodiments of the invention (FIG. 15B) with respect to the prior art (FIG. 15A).
Figure 15B:
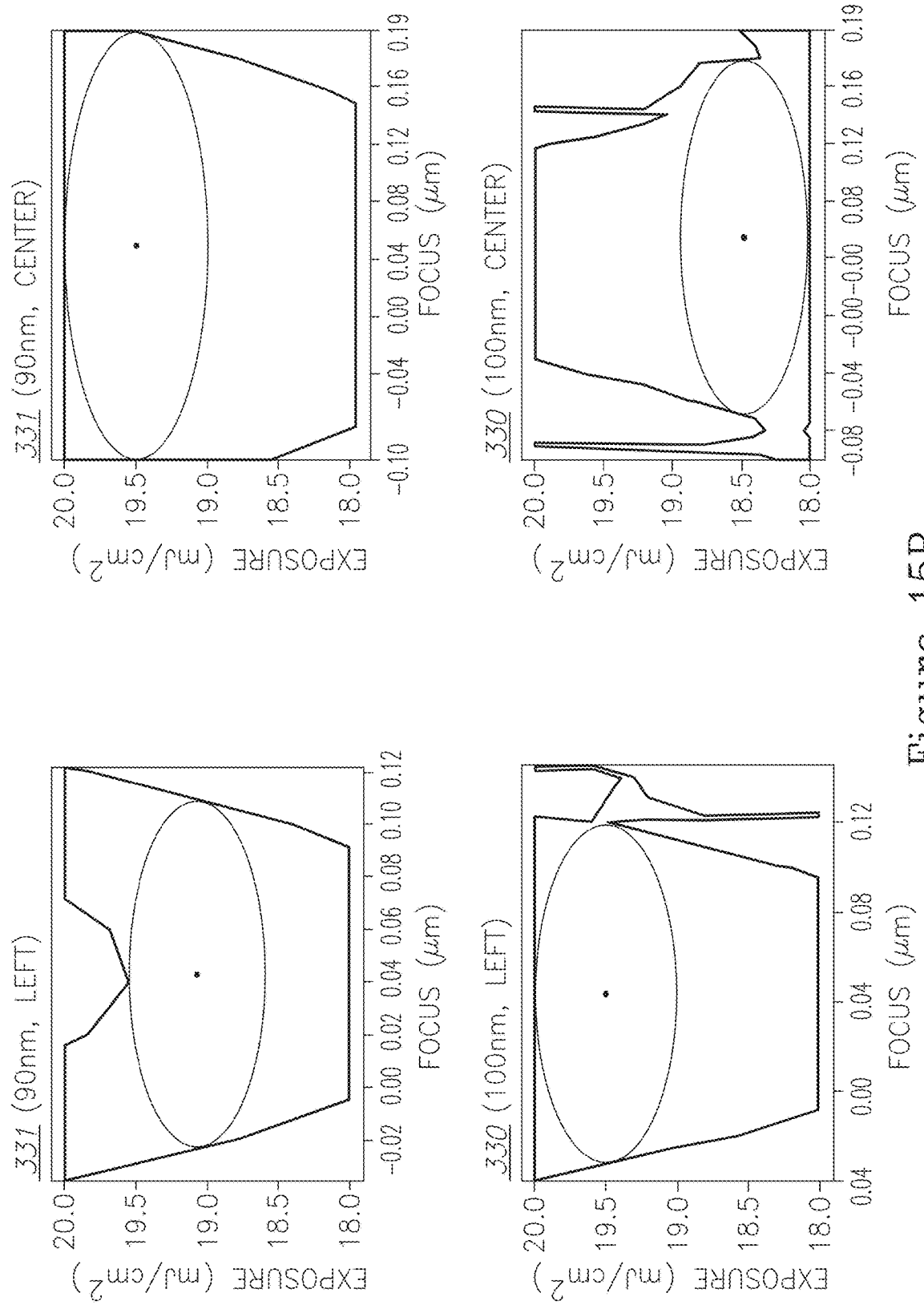

FIGS. 15A and 15B schematically illustrate a way for improving and optimizing the process window, according to some embodiments of the invention (FIG. 15B) with respect to the prior art (FIG. 15A). The process window is calculated in the example for ±10% CD variation from the nominal trench CD of 40 nm. For prior art targets 38B the left trench and center trench process windows are presented in FIG. 15A, and are smaller than left trench and center trench process windows for improved targets 331, 330 with pitches of 90 nm and 100 nm, respectively, as listed on Table 4 above. Target 330 is the best target in the illustrated example, providing the largest process window.

Similarly to Equation 1, Equation 1A expresses the PPE in terms of the Zernike sensitivities $\partial PPE_i/\partial Z_i$ and lens aberration information $\Delta Z_i$.

$$PPE(Z) \simeq -PPE(Z=0) + \sum_{i=1}^{36} \frac{\partial PPE(Z_i)}{\partial Z_i} \Delta Z_i = \qquad \text{Equation 1A}$$
$$-PPE(Z_1) + \sum_{i=2}^{36} \frac{\partial PPE(Z_i)}{\partial Z_i} \Delta Z_i$$

A cost function $\epsilon$ may be defined with respect to the differences between the Zernike sensitivities of the devices and the targets, similarly to Equation 2, as expressed in Equation 2A. $PPE\_D(Z_1)$ represents the device PPE for Z1 and $PPE\_T(Z_1)$ represents the target PPE for Z1 (i.e., they equal zero for zero lens aberration), while $PPE\_D(Z_i)$ represents the $i^{th}$ device PPE and $PPE\_T(Z_i)$ represents the $i^{th}$ target PPE. $\Delta Z_i$ represents the actual drift measured from the scanner and $\partial Z_i$ represents the drift coefficient to calculate sensitivity.

$$\varepsilon = \sum_{i=2}^{n} \sqrt{\left(\left(\frac{\partial(-PPE\_D(Z_1)+PPE\_D(Z_i))}{\partial Z_i} - \frac{\partial(-PPE\_T(Z_1)+PPE\_T(Z_i))}{\partial Z_i}\right)\Delta Z_i\right)^2} \qquad \text{Equation 2A}$$

Assuming $\Delta Z_i = \partial Z_i$, e.g., =0.02, Equation 4 follows from Equation 2A to represent the Euclidean distance in the LS case.

$$\varepsilon = \sum_{i=2}^{n} \sqrt{\left(\frac{(PPE\_D(Z_i)-PPE\_Z(Z_1))-}{(PPE\_T(Z_i))+(PPE\_T(Z_1))}\right)^2} \simeq \qquad \text{Equation 4}$$
$$\sum_{i=2}^{n} \sqrt{((PPE\_D(Z_i)-PPE\_T(Z_i)))^2}$$

FIG. 16 is a high level schematic flowchart of a method 400 of optimizing metrology target design, according to some embodiments of the invention. Steps of method 400 may be used in any other method described herein. Certain embodiments comprise computer program products comprising a computer readable storage medium having computer readable program embodied therewith and configured to carry out of the relevant stages of method 400. Certain embodiments comprise target design files of respective targets designed by embodiments of method 400.

Method 400 comprises starting with an initial target design determined according to metrology performance requirements (stage 402), and using a simulation tool (stage 404), comparing a Zernike sensitivity of pattern placement errors (PPEs) between the initial target design and at least one device design, with respect to at least two directions (stage 410), estimating a process window for the initial target design (stage 420), and deriving an improved metrology target design from the initial target design by modifying the initial target design to increase a correspondence in the Zernike sensitivity and to increase the process window (stage 430). At least one of comparing 410, estimating 420 and deriving 430 may be carried out by at least one computer processor (e.g., processor 89).

Deriving the improved metrology target design 430 may further comprise reiterating the comparing and the estimating for consecutively derived improved target designs (stage 440). The at least two directions may comprise a target design direction and a perpendicular direction thereto (X, Y respectively). The at least one device design may be tilted with respect to the target design direction. The pitch of the improved metrology target design may be 10-30% larger than a pitch of the at least one device design, in order to follow device behavior for given lens aberrations.

Method 400 may further comprise determining a target design with respect to a device design 450, comprising simulating pupil plane positions of zeroth and first diffraction order signals of an initial target design and of the device design (stage 455), modifying at least one parameter of the initial target design to yield an improved target design (stage 460), for example to provide a relation between the pupil plane positions of zeroth and first diffraction order signals in the improved target that corresponds to a relation thereof in the device design (stage 465). Method 400 may further comprise evaluating the correspondence of the relations with respect to at least one Zernike polynomial (stage 470), for example at least one Zernike polynomial which is asymmetric with respect to a segmentation direction of the initial target, as described above.

System 300 may be at least partially implemented by metrology module 100 (see FIG. 4) comprising at least one computer processor 89 configured to, starting with an initial target design determined according to metrology performance requirements, and using a simulation tool: compare a Zernike sensitivity of pattern placement errors (PPEs) between the initial target design and at least one device design, with respect to at least two directions, estimate a process window for the initial target design, and derive an improved metrology target design from the initial target design by modifying the initial target design to increase a correspondence in the Zernike sensitivity and to increase the process window. Metrology module 100 may be configured to reiterate the comparing and the estimating for consecutively derived improved target designs. The at least two directions may comprise a target design direction and a perpendicular direction thereto. The at least one device design may be tilted with respect to the target design direction. The pitch of the improved metrology target design may be 10-30% larger than a pitch of the at least one device design. Metrology targets designed by metrology module 100 and their target design files are likewise port of the present disclosure.

Metrology module 100 may be configured to determine a target design with respect to a device design, by simulating pupil plane positions of zeroth and first diffraction order signals of an initial target design and of the device design, and modifying at least one parameter of the initial target design to yield an improved target design, the modification carried out to provide a relation between the pupil plane positions of zeroth and first diffraction order signals in the improved target that corresponds to a relation thereof in the device design. Metrology module 100 may be further configured to evaluate the correspondence of the relations with respect to at least one Zernike polynomial, optionally with the at least one Zernike polynomial being asymmetric with respect to a segmentation direction of the initial target. Metrology module 100 may be further configured to determine a target segmentation with respect to the device design.

Metrology targets designed by metrology module 100 and their target design files are likewise port of the present disclosure.

Figure 17:
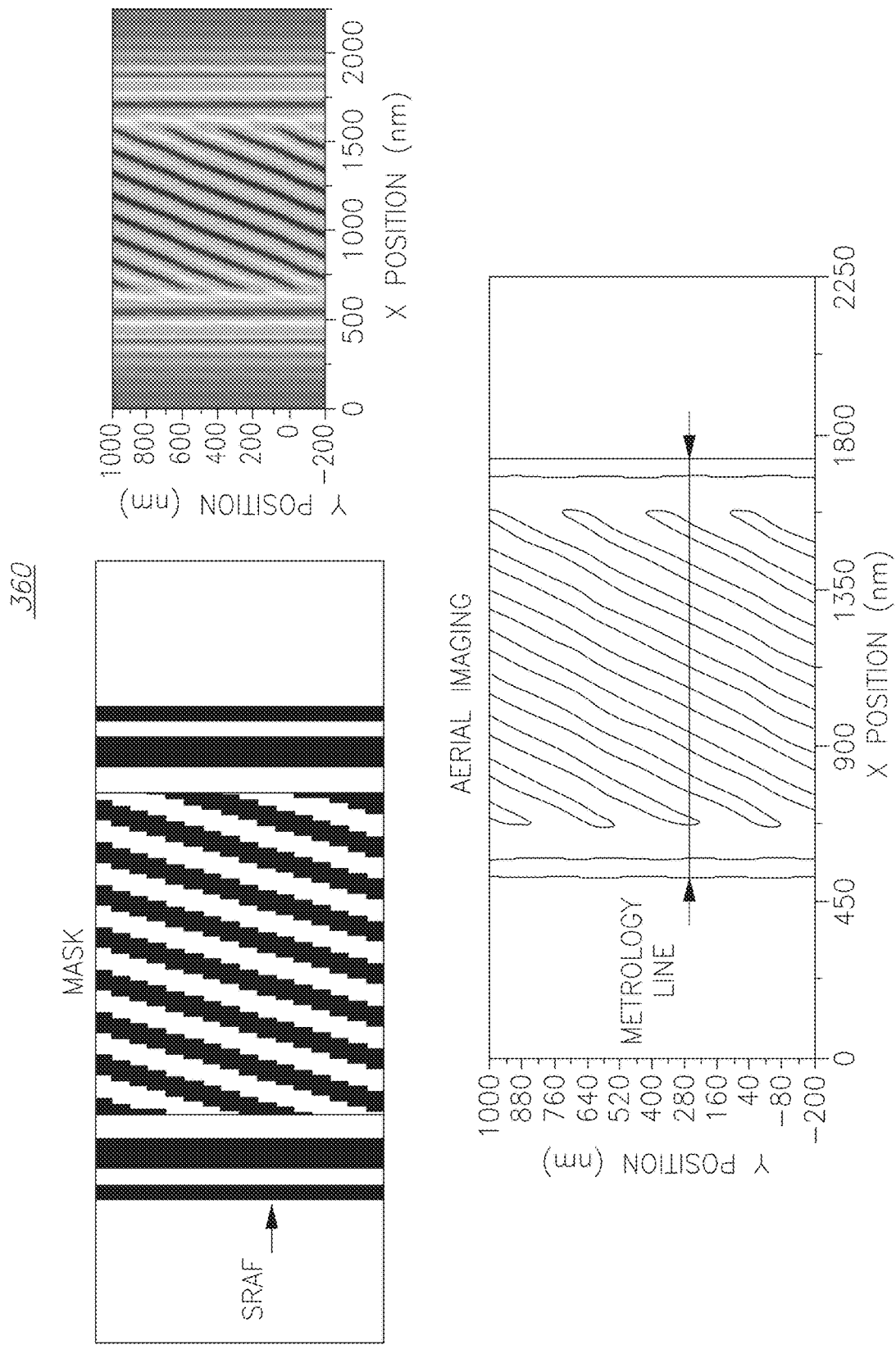
FIG. 17 is a high level schematic illustration of tilted targets, according to some embodiments of the invention.

FIG. 17 is a high level schematic illustration of tilted targets 360, according to some embodiments of the invention. Certain embodiments comprise tilted metrology targets 360 having elements and/or segmentation which are tilted, e.g., at the same tilt angle as the devices that are to measured, possible with addition of SRAF features that improve the production accuracy of targets 360, in particular with respect to line edges.

Certain embodiments combine the disclosure provided above with information from the publications Lee et al. 2016, Metrology target design (MTD) solution for diagonally orientated DRAM layer (Proc. SPIE 9778, Metrology, Inspection, and Process Control for Microlithography XXX, 97782R (Mar. 8, 2016); doi:10.1117/12.2218659) and Lee et al. 2016, Lithography aware overlay metrology target design method (Proc. SPIE 9778, Metrology, Inspection, and Process Control for Microlithography XXX, 97781L (Mar. 24, 2016); doi:10.1117/12.2218653), by the same first inventor and colleagues. These publications are incorporated herein by reference in their entirety.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram portion or portions.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram portion or portions.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram portion or portions.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
   calculating, with at least one processor, a Zernike sensitivity of pattern placement errors (PPEs) of at least one device design and of a plurality of metrology target designs;
   selecting, with at least one processor, a best metrology target design according to a value of a cost function derived from the calculated Zernike sensitivities, the cost function quantifying a similarity of the Zernike sensitivity between the at least one device design and the plurality of metrology target designs;
   controlling, with at least one processor, a scanner to modify a pattern pitch to produce one or more metrology targets having the best metrology target design on a sample; and
   performing, with an overlay metrology tool, one or more overlay metrology measurements of the one or more metrology targets having the best metrology target design.

2. The method of claim 1, wherein the Zernike sensitivity is calculated with respect to Zernike coefficients Z4 . . . Z36.

3. The method of claim 2, wherein the Zernike sensitivity is calculated with respect to odd Zernike coefficients only.

4. The method of claim 3, wherein the Zernike sensitivity is calculated only with respect to Zernike coefficients Z8, Z11, Z15, Z20, Z24, Z27, Z31, and Z35.

5. The method of claim 1, wherein the cost function comprises a distance metric between the PPE Zernike sensitivity of the at least one device design and the PPE Zernike sensitivity of the plurality of metrology target designs.

6. A metrology module comprising at least one computer processor configured to:
calculate a Zernike sensitivity of pattern placement errors (PPEs) of at least one device design and of a plurality of metrology target designs;
select a best metrology target design according to a value of a cost function derived from the calculated Zernike sensitivities, the cost function quantifying a similarity of the Zernike sensitivity between the at least one device design and the plurality of metrology target designs;
control a scanner to modify a pattern pitch to produce one or more metrology targets having the best metrology target design on a sample; and
perform, with an overlay metrology tool, one or more overlay metrology measurements of the one or more metrology targets having the best metrology target design.

7. The metrology module of claim 6, wherein the Zernike sensitivity is calculated with respect to Zernike coefficients Z4 . . . Z36.

8. The metrology module of claim 7, wherein the Zernike sensitivity is calculated with respect to odd Zernike coefficients only.

9. The metrology module of claim 8, wherein the Zernike sensitivity is calculated only with respect to Zernike coefficients Z8, Z11, Z15, Z20, Z24, Z27, Z31, and Z35.

10. The metrology module of claim 6, wherein the cost function comprises a distance metric between the PPE Zernike sensitivity of the at least one device design and the PPE Zernike sensitivity of the plurality of metrology target designs.

11. A method comprising:
for each of at least one device design and a plurality of target design candidates:
repeatedly for a plurality of runs:
generating, with at least one processor, a plurality of $N_i$ ($N_i>50$) Zernike coefficient values for each of a plurality of Zernike polynomials $Z_i$, the values generated pseudo-randomly with respect to specified distributions over specified ranges,
calculating, with at least one processor, PPEs for each of the Zernike polynomials, and
calculating, with at least one processor, a respective PPE measure for the run; and
deriving, with at least one processor, a distribution of the calculated respective PPE measures;
correlating, with at least one processor, each of the derived target design candidate distributions with the at least one derived device design distribution to yield for each target design candidate a device correspondence measure; and
selecting, with at least one processor, a best metrology target design according to the derived device correspondence measures;
controlling, with at least one processor, a scanner to modify a pattern pitch to produce one or more metrology targets having the best metrology target design on a sample; and
performing, with an overlay metrology tool, one or more overlay metrology measurements of the one or more metrology targets having the best metrology target design.

12. The method of claim 11, further comprising selecting the target design candidates to represent segmentation alternatives of a specified target design.

13. The method of claim 12, further comprising ranking the segmentation alternatives using the device correspondence measure.

14. The method of claim 11, further comprising carrying out the calculating stages in parallel to a metrology simulation process and integrating a ranking using the device correspondence measure with a ranking derived from the metrology simulation process.

15. The method of claim 11, further comprising carrying out the method for multiple device designs and carrying out the selecting with respect to the device correspondence measures derived for all the device designs.

16. The method of claim 15, wherein the selecting is carried out with respect to a robustness measure, derived from the multiple device correspondence measures.

17. A metrology module comprising at least one computer processor configured to, for each of at least one device design and a plurality of target design candidates:
repeatedly for a plurality of runs:
generate, with at least one processor, a plurality of $N_i$ ($N_i>100$) Zernike coefficient values for each of a plurality of Zernike polynomials $Z_i$, the values generated pseudo-randomly with respect to specified distributions over specified ranges,
calculate, with at least one processor, PPEs for each of the Zernike polynomials, and
calculate, with at least one processor, a respective PPE measure for the run; and
derive, with at least one processor, a distribution of the calculated respective PPE measures;
correlate, with at least one processor, each of the derived target design candidate distributions with the at least one derived device design distribution to yield for each target design candidate a device correspondence measure;
select, with at least one processor, a best metrology target design according to the derived device correspondence measures;
controlling, with at least one processor, a scanner to modify a pattern pitch to produce one or more metrology targets having the best metrology target design on a sample; and
performing, with an overlay metrology tool, one or more overlay metrology measurements of the one or more metrology targets having the best metrology target design.

18. The metrology module of claim 17, further configured to select the target design candidates to represent segmentation alternatives of a specified target design.

19. The metrology module of claim 18, further configured to rank the segmentation alternatives using the device correspondence measure.

20. The metrology module of claim 17, further configured to carry out the calculating stages in parallel to a metrology simulation process and to integrate a ranking using the device correspondence measure with a ranking derived from the metrology simulation process.

21. The metrology module of claim 17, further configured to use multiple device designs and select the best target with respect to the device correspondence measures derived for all the device designs.

22. The metrology module of claim 21, further configured to select the best target with respect to a robustness measure, derived from the multiple device correspondence measures.

23. A method of optimizing metrology target design, the method comprising:
comparing, with at least one processor, a Zernike sensitivity of pattern placement errors (PPEs) between an initial target design and at least one device design, with respect to at least two directions,
estimating, with at least one processor, a process window for the initial target design, and
deriving, with at least one processor, an improved metrology target design from the initial target design by modifying the initial target design to increase a correspondence in the Zernike sensitivity and to increase the process window; and
controlling, with at least one processor, a scanner to modify a pattern pitch to produce one or more metrology targets having the improved metrology target design on a sample; and
performing, with an overlay metrology tool, one or more overlay metrology measurements of the one or more metrology targets having the improved metrology target design.

24. The method of claim 23, wherein the deriving further comprises reiterating the comparing and the estimating for consecutively derived improved target designs.

25. The method of claim 23, wherein the at least two directions comprise a target design direction and a perpendicular direction thereto.

26. The method of claim 25, wherein the at least one device design is tilted with respect to the target design direction.

27. The method of claim 23, wherein a pitch of the improved metrology target design is 10-30% larger than a pitch of the at least one device design.

28. A metrology module comprising at least one computer processor configured to:
compare a Zernike sensitivity of pattern placement errors (PPEs) between the initial target design and at least one device design, with respect to at least two directions,
estimate a process window for the initial target design, and
derive an improved metrology target design from the initial target design by modifying the initial target design to increase a correspondence in the Zernike sensitivity and to increase the process window; and
control a scanner to modify a pattern pitch to produce one or more metrology targets having the improved metrology target design on a sample,
perform one or more overlay metrology measurements of the one or more metrology targets having the improved metrology target design.

29. The metrology module of claim 28, further configured to reiterate the comparing and the estimating for consecutively derived improved target designs.

30. The metrology module of claim 28, wherein the at least two directions comprise a target design direction and a perpendicular direction thereto.

31. The metrology module of claim 30, wherein the at least one device design is tilted with respect to the target design direction.

32. The metrology module of claim 28, wherein a pitch of the improved metrology target design is 10-30% larger than a pitch of the at least one device design.

33. A method of determining a target design with respect to a device design, the method comprising:
simulating, with at least one processor, pupil plane positions of zeroth and first diffraction order signals of an initial target design and of the device design, and
modifying, with at least one processor, at least one parameter of the initial target design to yield an improved target design, the modification carried out to provide a relation between the pupil plane positions of zeroth and first diffraction order signals in the improved target that corresponds to a relation thereof in the device design;
controlling, with at least one processor, a scanner to modify a pattern pitch to produce one or more metrology targets having the improved metrology target design on a sample; and
performing, with an overlay metrology tool, one or more overlay metrology measurements of the one or more metrology targets having the improved metrology target design.

34. The method of claim 33, wherein the correspondence of the relations is evaluated with respect to at least one Zernike polynomial.

35. The method of claim 34, wherein the at least one Zernike polynomial is asymmetric with respect to a segmentation direction of the initial target.

36. The method of claim 33, wherein the determining comprises determining a target segmentation with respect to the device design.

37. A metrology module comprising at least one computer processor configured to:
simulate pupil plane positions of zeroth and first diffraction order signals of an initial target design and of the device design, and
modify at least one parameter of the initial target design to yield an improved target design, the modification carried out to provide a relation between the pupil plane positions of zeroth and first diffraction order signals in the improved target that corresponds to a relation thereof in the device design;
control a scanner to modify a pattern pitch to produce one or more metrology targets having the improved metrology target design on a sample; and
perform, with an overlay metrology tool, one or more overlay metrology measurements of the one or more metrology targets having the improved metrology target design.

38. The metrology module of claim 37, wherein the at least one computer processor is further configured to evaluate the correspondence of the relations with respect to at least one Zernike polynomial.

39. The metrology module of claim 38, wherein the at least one Zernike polynomial is asymmetric with respect to a segmentation direction of the initial target.

40. The metrology module of claim 37, further configured to determine a target segmentation with respect to the device design.

* * * * *